US012628596B2

(12) United States Patent     (10) Patent No.:   US 12,628,596 B2

Kim et al.        (45) Date of Patent:    May 12, 2026

(54) METHOD OF MANUFACTURING INTEGRATED CIRCUIT DEVICE

(71) Applicant: Samsung Electronics Co., Ltd.,
Suwon-si (KR)

(72) Inventors: Youngwoo Kim, Hwaseong-si (KR);
Yonghan Park, Suwon-si (KR); **Jiho
Park, Suwon-si (KR); Geumjung
Seong, Suwon-si (KR); Seunguk Han**,
Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 433 days.

(21) Appl. No.: 18/355,520

(22) Filed: Jul. 20, 2023

(65) Prior Publication Data

US 2024/0071771 A1     Feb. 29, 2024

(30) Foreign Application Priority Data

Aug. 31, 2022    (KR) ........................ 10-2022-0110155

(51) Int. Cl.
H01L 21/311       (2006.01)
H01L 21/308       (2006.01)
(52) U.S. Cl.
CPC .... H01L 21/31144 (2013.01); H01L 21/3086
(2013.01)
(58) Field of Classification Search
CPC ........... H01L 21/31144; H01L 21/3086; H10B
12/053; H10B 12/09; H10B 12/34; H10B
12/488; H10B 12/50; H10B 12/02; H10B
12/05
See application file for complete search history.

(56) References Cited

U.S. PATENT DOCUMENTS

| | | | |
|---|---|---|---|
| 9,276,074 | B2 | 3/2016 | Choi et al. |
| 10,312,090 | B2 | 6/2019 | Chang et al. |
| 10,755,969 | B2 | 8/2020 | Chu et al. |
| 2012/0289019 | A1 | 11/2012 | Im et al. |
| 2013/0109148 | A1 | 5/2013 | Oh et al. |

(Continued)

FOREIGN PATENT DOCUMENTS

| | | |
|---|---|---|
| KR | 10-1929478 B1 | 12/2018 |
| KR | 10-2020-0054407 A | 5/2020 |

*Primary Examiner* — Yasser A Abdelaziez
(74) *Attorney, Agent, or Firm* — Harness, Dickey &
Pierce, P.L.C.

(57) ABSTRACT

A method of manufacturing an integrated circuit device
includes preparing a semiconductor substrate having an
active area and a field area, sequentially forming a lower
insulation layer, a buried layer, a first sacrificial layer, a
second sacrificial layer, and a third sacrificial layer on the
semiconductor substrate, removing a portion of the third
sacrificial layer to form a first sacrificial pattern, removing
a portion of the second sacrificial layer and the first sacri-
ficial pattern to form a second sacrificial pattern, removing
a portion of the first sacrificial layer and the second sacri-
ficial pattern to form a third sacrificial pattern, removing a
portion of the buried layer and the third sacrificial pattern to
form a buried pattern, and removing a portion of the lower
insulation layer and a portion of the semiconductor substrate
by using the buried pattern as an etch mask to form a word
line trench.

20 Claims, 29 Drawing Sheets

(56)          References Cited

U.S. PATENT DOCUMENTS

| 2014/0024219 | A1* | 1/2014 | Jung | ................... | H01L 21/0337 |
| | | | | | 257/E21.215 |
| 2016/0203983 | A1* | 7/2016 | Kim | .................. | H01L 21/31144 |
| | | | | | 438/695 |
| 2017/0110364 | A1 | 4/2017 | Song et al. | | |
| 2017/0372906 | A1* | 12/2017 | Jang | .................. | H01L 21/28132 |
| 2018/0102260 | A1 | 4/2018 | Hwang et al. | | |
| 2022/0270879 | A1* | 8/2022 | Cao | ........................ | H10D 1/716 |

* cited by examiner

FIG. 3B

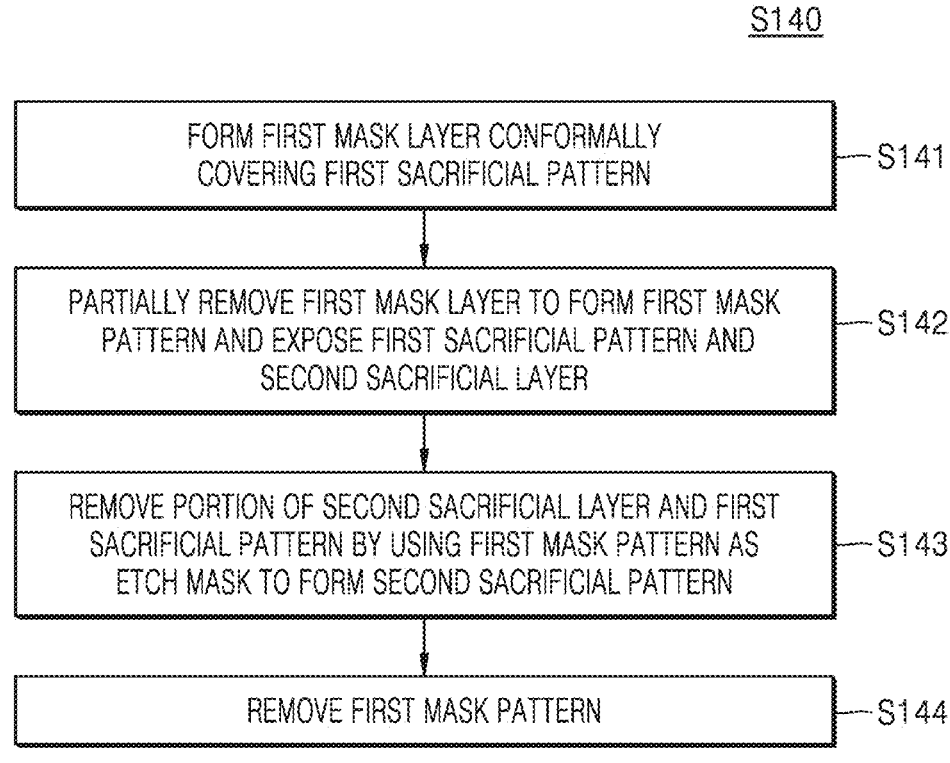

<u>S140</u>

FORM FIRST MASK LAYER CONFORMALLY
COVERING FIRST SACRIFICIAL PATTERN — S141

PARTIALLY REMOVE FIRST MASK LAYER TO FORM FIRST MASK
PATTERN AND EXPOSE FIRST SACRIFICIAL PATTERN AND
SECOND SACRIFICIAL LAYER — S142

REMOVE PORTION OF SECOND SACRIFICIAL LAYER AND FIRST
SACRIFICIAL PATTERN BY USING FIRST MASK PATTERN AS
ETCH MASK TO FORM SECOND SACRIFICIAL PATTERN — S143

REMOVE FIRST MASK PATTERN — S144

FIG. 3C

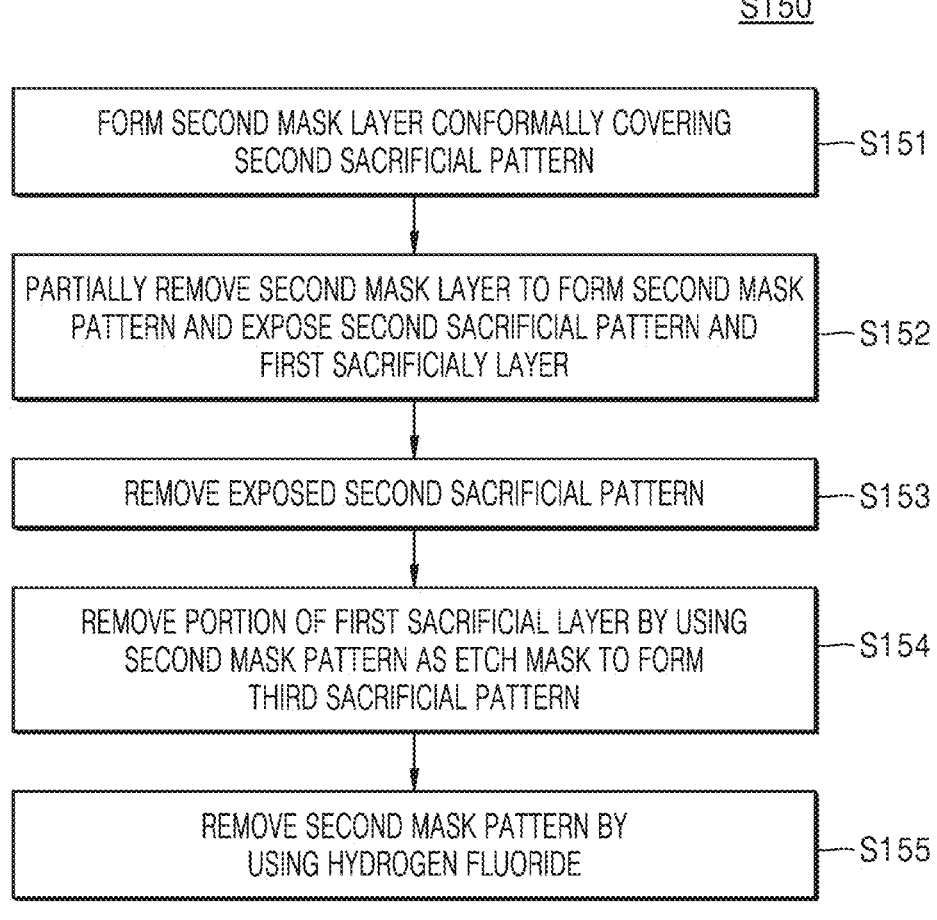

S150

FORM SECOND MASK LAYER CONFORMALLY COVERING SECOND SACRIFICIAL PATTERN — S151

PARTIALLY REMOVE SECOND MASK LAYER TO FORM SECOND MASK PATTERN AND EXPOSE SECOND SACRIFICIAL PATTERN AND FIRST SACRIFICIALY LAYER — S152

REMOVE EXPOSED SECOND SACRIFICIAL PATTERN — S153

REMOVE PORTION OF FIRST SACRIFICIAL LAYER BY USING SECOND MASK PATTERN AS ETCH MASK TO FORM THIRD SACRIFICIAL PATTERN — S154

REMOVE SECOND MASK PATTERN BY USING HYDROGEN FLUORIDE — S155

FIG. 3D

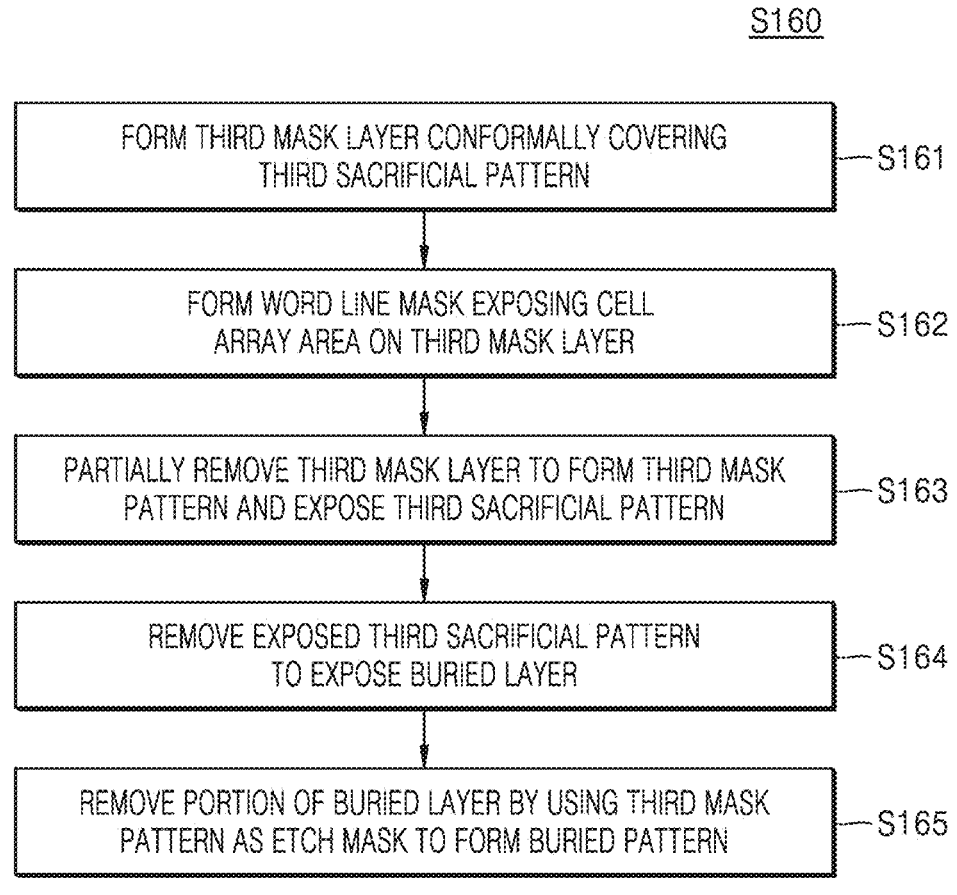

S160

FORM THIRD MASK LAYER CONFORMALLY COVERING
THIRD SACRIFICIAL PATTERN — S161

FORM WORD LINE MASK EXPOSING CELL
ARRAY AREA ON THIRD MASK LAYER — S162

PARTIALLY REMOVE THIRD MASK LAYER TO FORM THIRD MASK
PATTERN AND EXPOSE THIRD SACRIFICIAL PATTERN — S163

REMOVE EXPOSED THIRD SACRIFICIAL PATTERN
TO EXPOSE BURIED LAYER — S164

REMOVE PORTION OF BURIED LAYER BY USING THIRD MASK
PATTERN AS ETCH MASK TO FORM BURIED PATTERN — S165

FIG. 4A
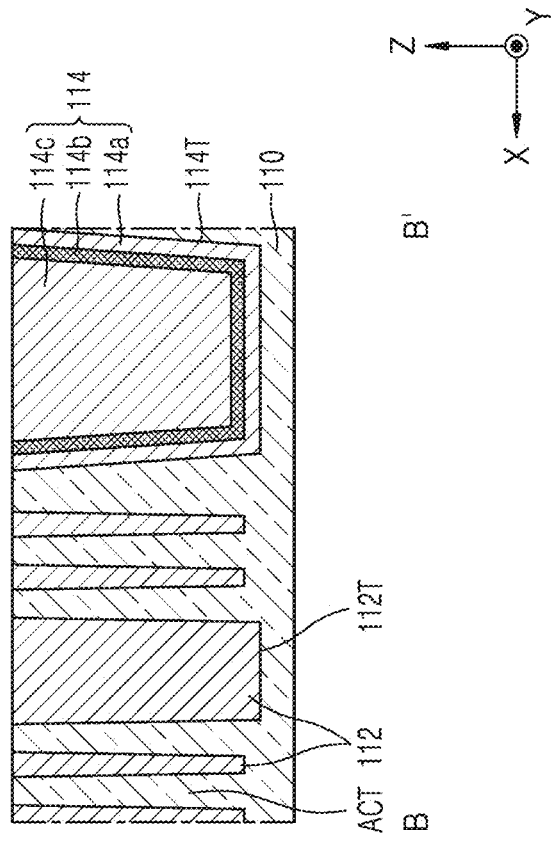
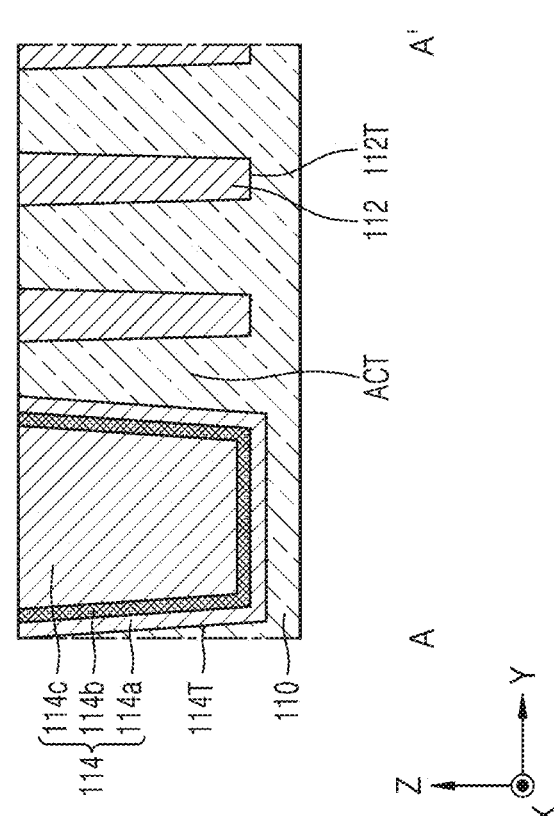

FIG. 4B
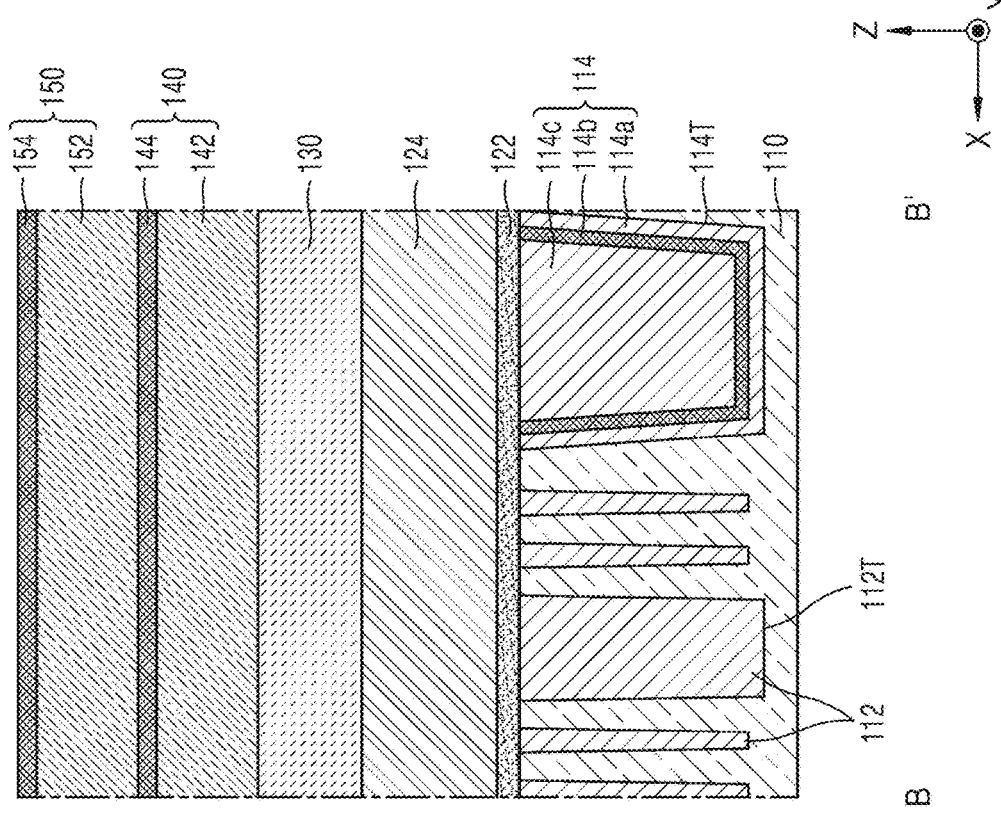
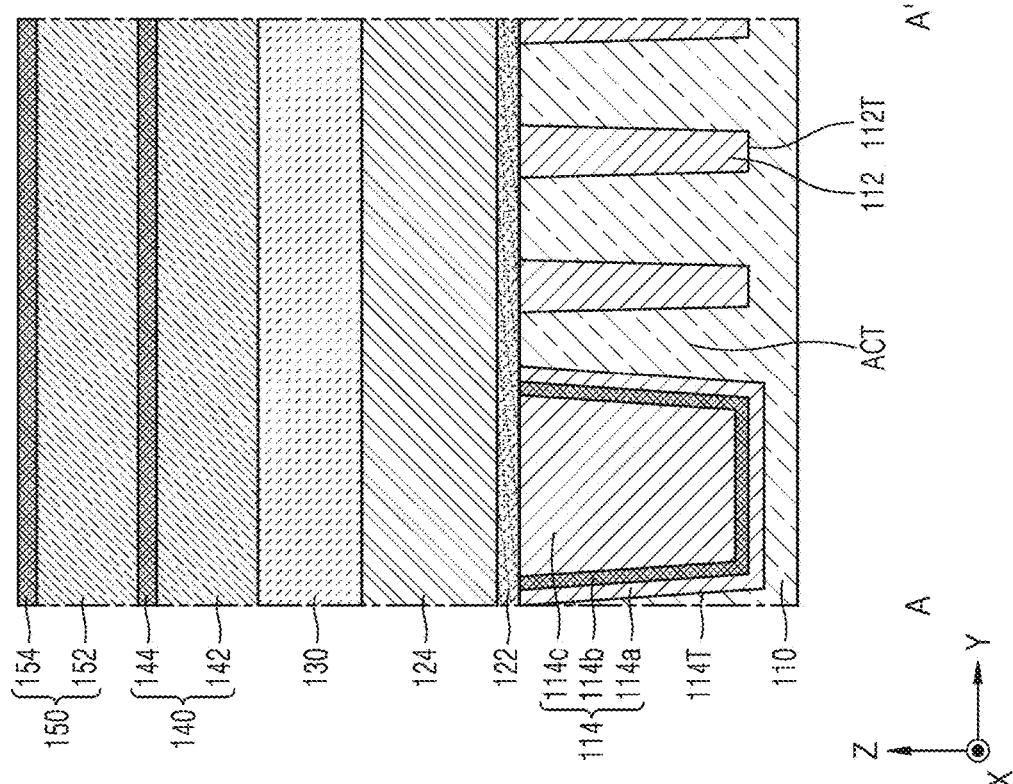

FIG. 4L
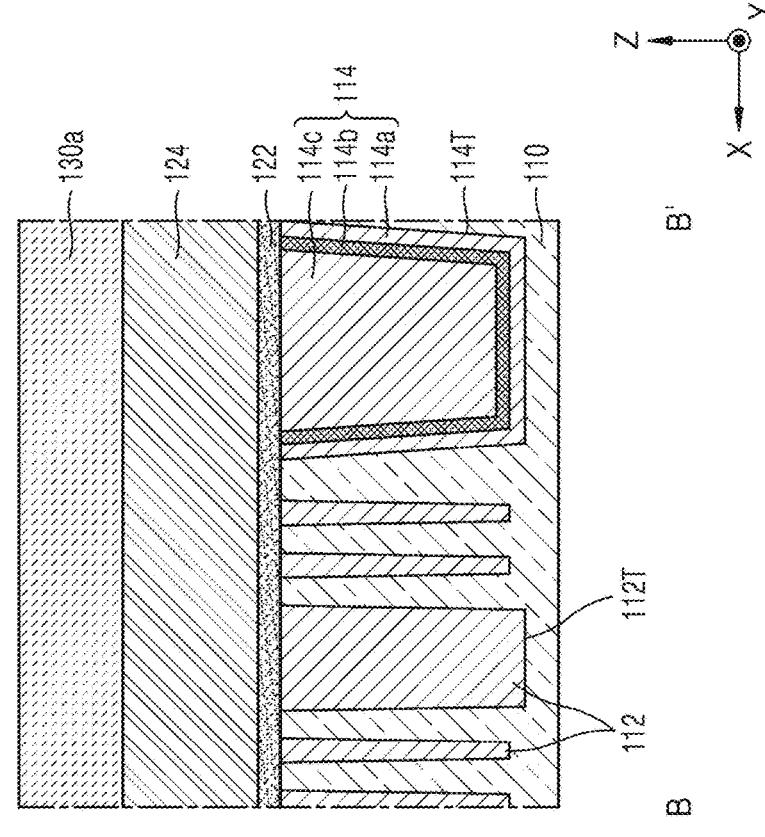
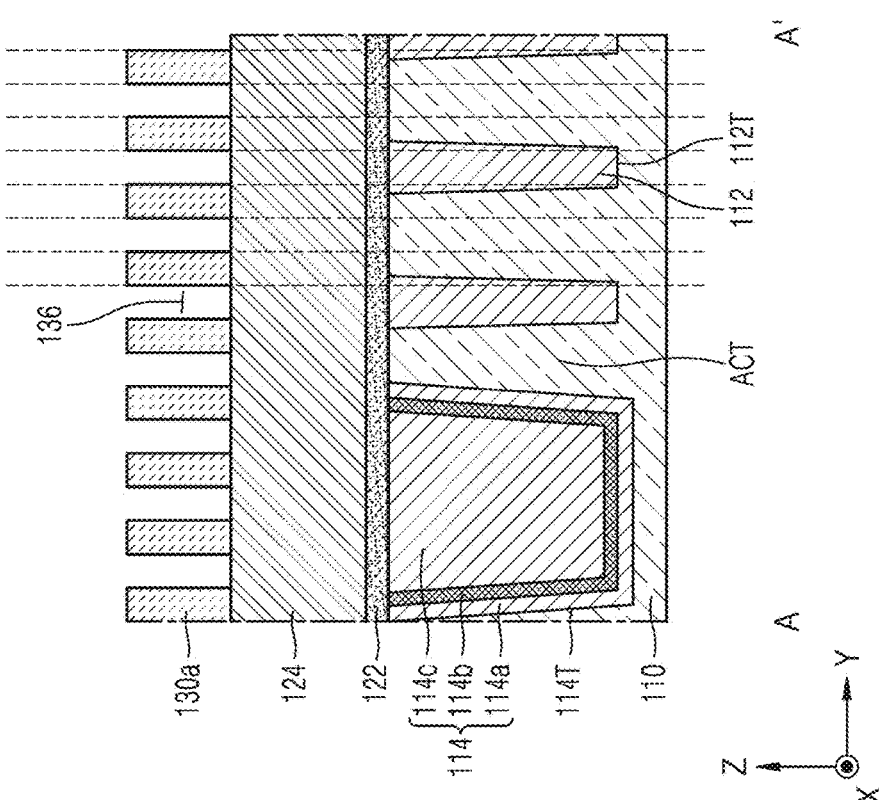

FIG. 4M
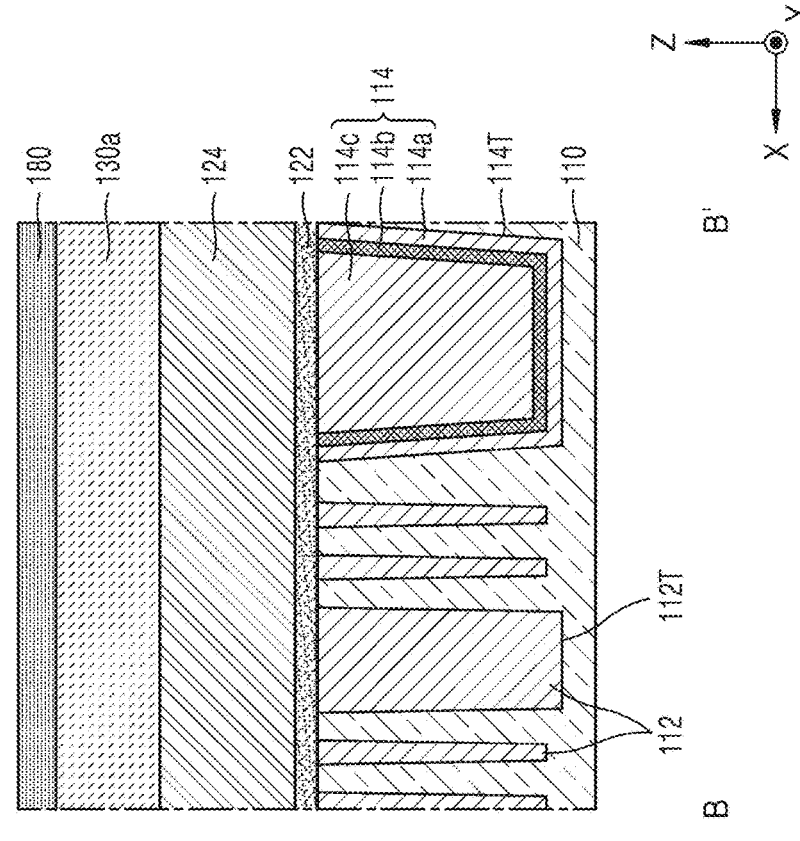
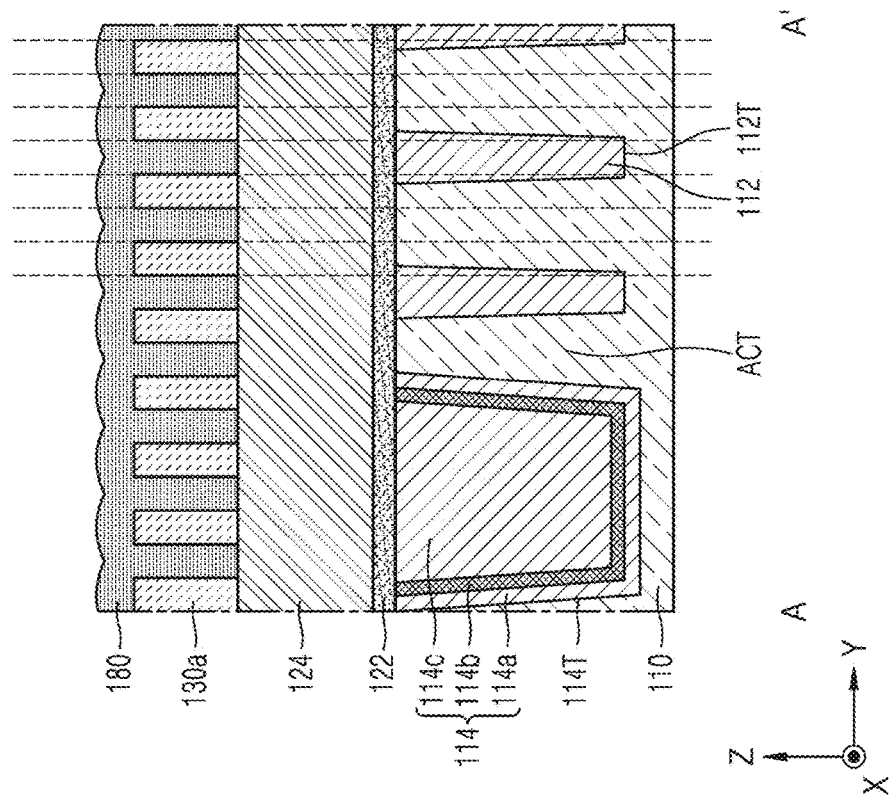

FIG. 4T
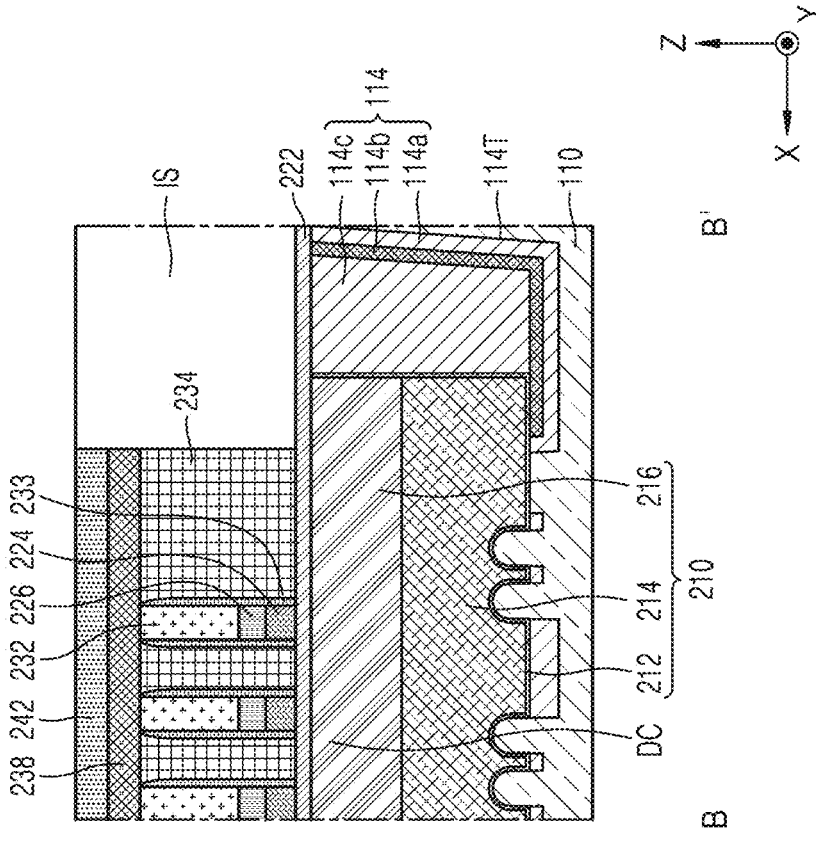
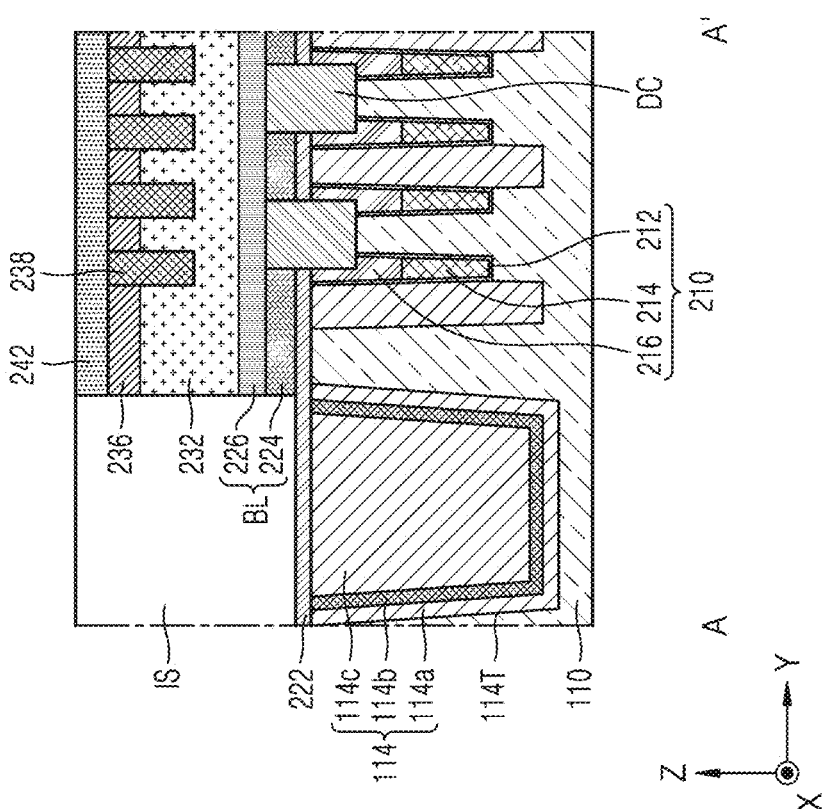

FIG. 5A
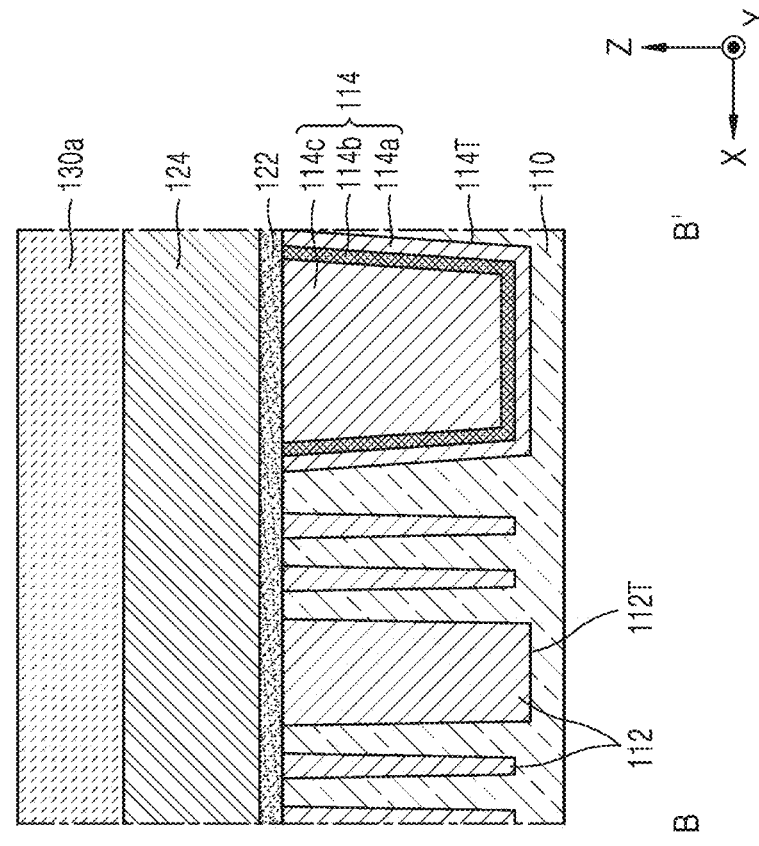
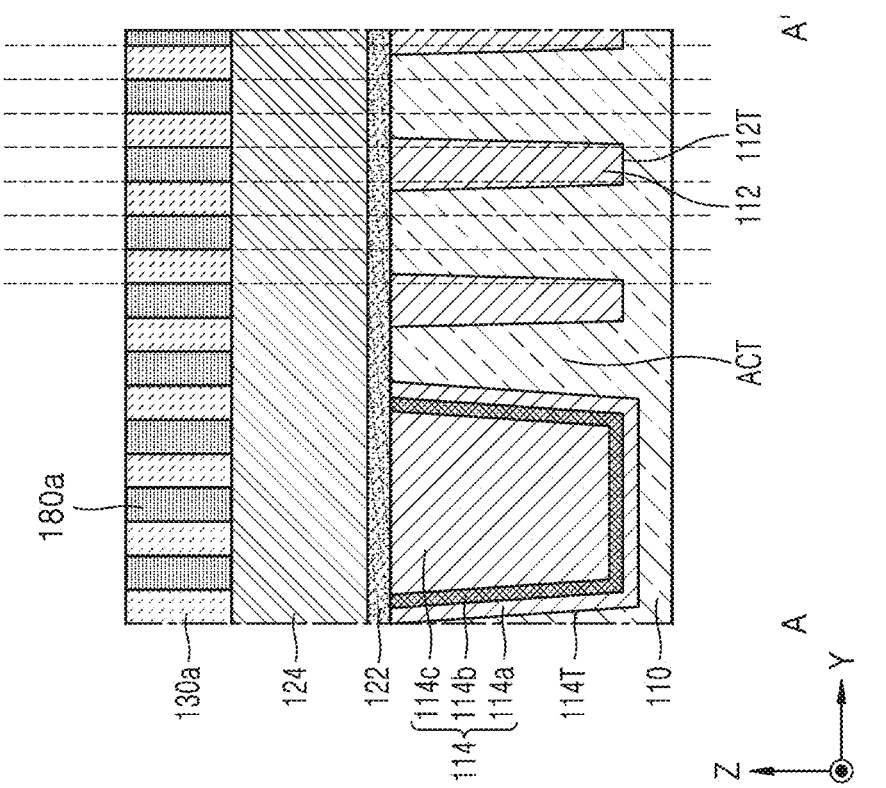

FIG. 5B
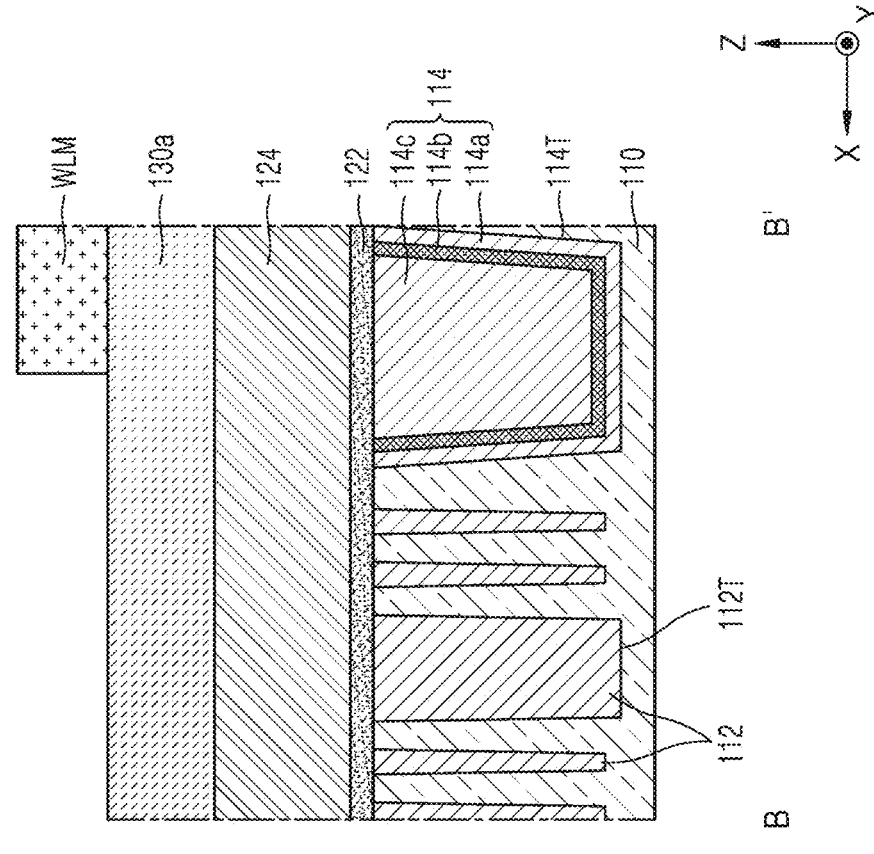
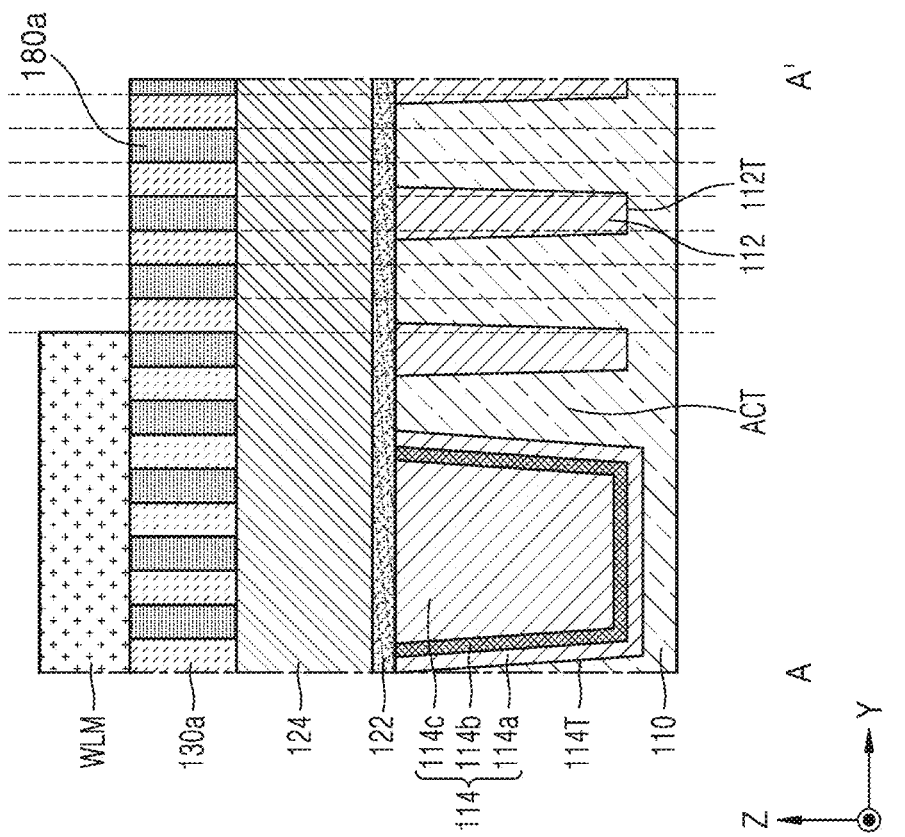

METHOD OF MANUFACTURING INTEGRATED CIRCUIT DEVICE

CROSS-REFERENCE TO RELATED APPLICATION

This application is based on and claims priority under 35 U.S.C. § 119 to Korean Patent Application No. 10-2022-0110155, filed on Aug. 31, 2022, in the Korean Intellectual Property Office, the disclosure of which is incorporated by reference herein in its entirety.

BACKGROUND

Example embodiments relate to a method of manufacturing an integrated circuit device, and more particularly, to a method of manufacturing an integrated circuit device including a buried channel array transistor.

Recently, as the degree of integration of integrated circuit devices increases progressively, a structure of integrated circuit devices including a buried channel array transistor (BCAT) and having a type or structure where a plurality of word lines are buried in a substrate has been proposed. Therefore, various researches for improving and stabilizing the operation and reliability of BCATs are being done.

SUMMARY

Example embodiments provide a method of manufacturing an integrated circuit device, in which the degree of integration of the integrated circuit device increases, and thus, electrical reliability is maintained despite a reduction in area of a device region.

According to some example embodiments, there is provided a method of manufacturing an integrated circuit device, the method including preparing a semiconductor substrate having an active area and a field area, sequentially forming a lower insulation layer, a buried layer, a first sacrificial layer, a second sacrificial layer, and a third sacrificial layer on the semiconductor substrate, removing a portion of the third sacrificial layer to form a first sacrificial pattern, removing a portion of the second sacrificial layer and the first sacrificial pattern to form a second sacrificial pattern, removing a portion of the first sacrificial layer and the second sacrificial pattern to form a third sacrificial pattern, removing a portion of the buried layer and the third sacrificial pattern to form a buried pattern, and removing a portion of the lower insulation layer and a portion of the semiconductor substrate by using the buried pattern as an etch mask to form a word line trench, wherein the first sacrificial layer includes polysilicon.

According to various example embodiments, there is provided a method of manufacturing an integrated circuit device, the method including forming a semiconductor substrate having a peripheral circuit area and a cell array area, forming a lower insulation layer on the semiconductor substrate, forming a buried layer on the lower insulation layer, forming a first sacrificial layer on the buried layer, the first sacrificial layer including polysilicon, forming a second sacrificial layer, including a first lower sacrificial layer and a first upper sacrificial layer having an etch selectivity with respect to each other, on the first sacrificial layer, forming, on the second sacrificial layer, a third sacrificial layer, including a second lower sacrificial layer and a second upper sacrificial layer having an etch selectivity with respect to each other, removing a portion of the third sacrificial layer to form a first sacrificial pattern, removing a portion of the second sacrificial layer and the first sacrificial pattern to form a second sacrificial pattern, removing a portion of the first sacrificial layer and the second sacrificial pattern to form a third sacrificial pattern, removing a portion of the buried layer and the third sacrificial pattern to form a buried pattern, and removing a portion of the lower insulation layer and a portion of the semiconductor substrate by using the buried pattern as an etch mask to form a word line trench.

According to various example embodiments, there is provided a method of manufacturing an integrated circuit device, the method including forming a semiconductor substrate having a peripheral circuit area and a cell array area that includes an active area and a field area, forming a lower insulation layer on the semiconductor substrate, forming a buried layer on the lower insulation layer, forming a first sacrificial layer on the buried layer, the first sacrificial layer including polysilicon, forming a second sacrificial layer, including a first lower sacrificial layer and a first upper sacrificial layer having an etch selectivity with respect to each other, on the first sacrificial layer, forming, on the second sacrificial layer, a third sacrificial layer, including a second lower sacrificial layer and a second upper sacrificial layer having an etch selectivity with respect to each other, removing the third sacrificial layer to form a first sacrificial pattern exposing the second sacrificial layer, forming a first mask layer conformally covering the first sacrificial pattern and the exposed second sacrificial layer, partially removing the first mask layer to form a first mask pattern covering a sidewall of the first sacrificial pattern, removing a portion of the second sacrificial layer and the first sacrificial pattern by using the first mask pattern as an etch mask to form a second sacrificial pattern exposing the first sacrificial layer, forming a second mask layer conformally covering the second sacrificial pattern and the exposed first sacrificial layer, partially removing the second mask layer to form a second mask pattern covering a sidewall of the second sacrificial pattern, removing a portion of the first sacrificial layer and the second sacrificial pattern by using the second mask pattern as an etch mask to form a third sacrificial pattern exposing the buried layer, forming a third mask layer conformally covering the third sacrificial pattern and the exposed buried layer, partially removing the third mask layer to form a third mask pattern covering the buried layer and a sidewall of the third sacrificial pattern, removing a portion of the buried layer and the third sacrificial pattern by using the third mask pattern as an etch mask to form a buried pattern, and removing a portion of the lower insulation layer and a portion of the semiconductor substrate by using the buried pattern as an etch mask to form a word line trench passing through the active area and the field area.

BRIEF DESCRIPTION OF THE DRAWINGS

Embodiments will be more clearly understood from the following detailed description taken in conjunction with the accompanying drawings in which:

FIG. 3B is a block diagram for describing a method of manufacturing an integrated circuit device, according to various example embodiments;

FIG. 3C is a block diagram for describing a method of manufacturing an integrated circuit device, according to various example embodiments;

FIG. 3D is a block diagram for describing a method of manufacturing an integrated circuit device, according to various example embodiments;

FIGS. 5A and 5B are cross-sectional views illustrating cross-sectional surfaces taken along line A-A' and line B-B' of FIG. 2 in a process sequence for describing a method of manufacturing an integrated circuit device, according to various example embodiments.

DETAILED DESCRIPTION OF VARIOUS EXAMPLE EMBODIMENTS

Figure 1:
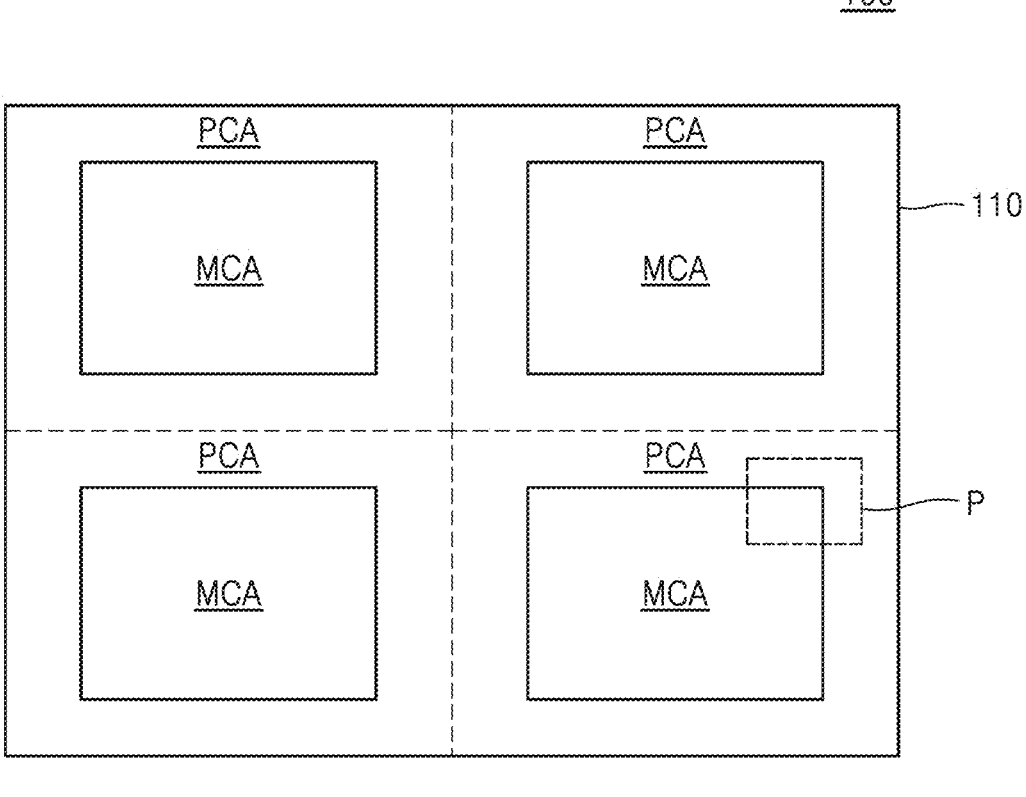
FIG. 1 is a layout diagram illustrating an integrated circuit device according to various example embodiments.

Hereinafter, various example embodiments will be described in detail with reference to the accompanying drawings. Like reference numerals refer to like elements in the drawings, and their repeated descriptions are omitted.

Figure 2:
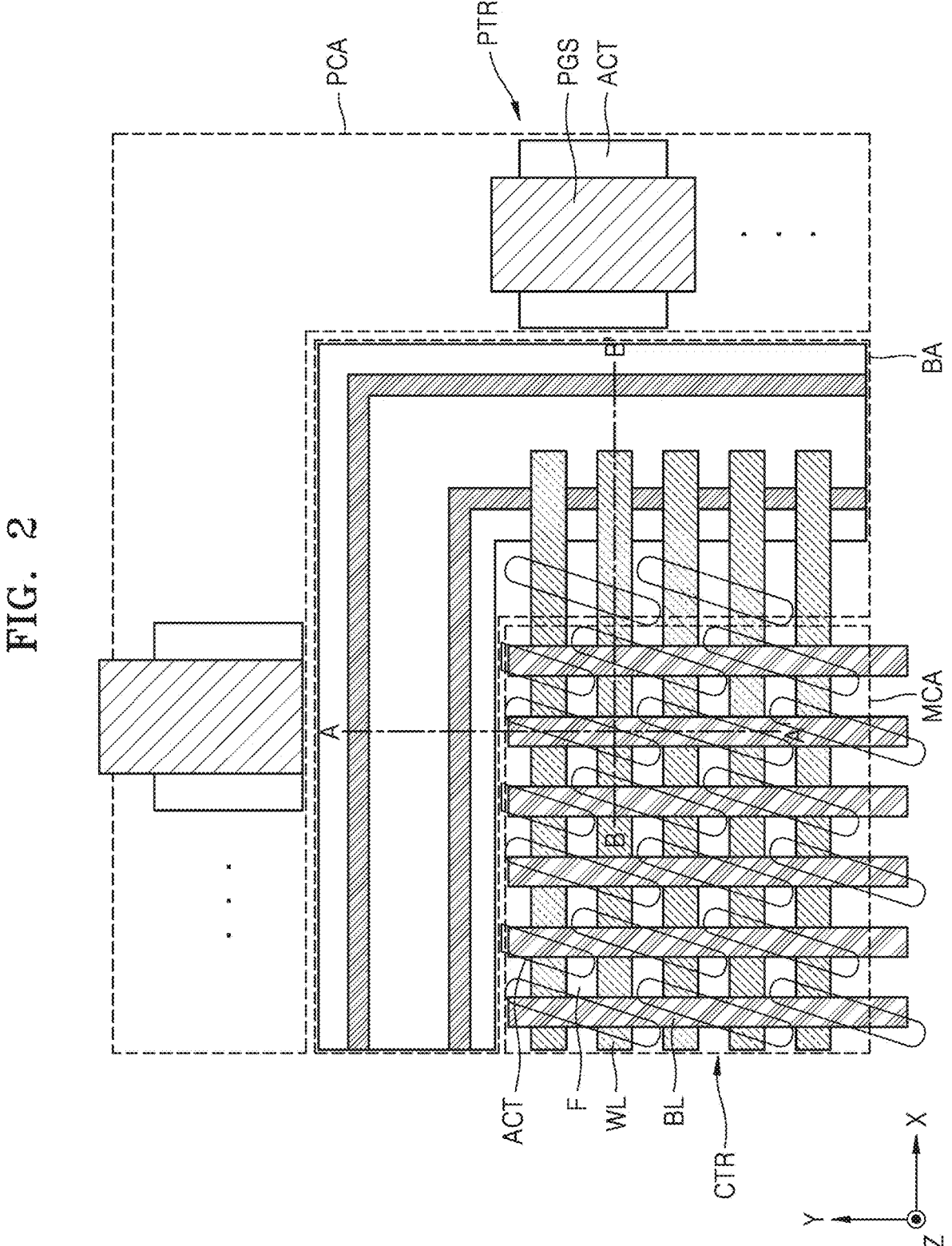
FIG. 2 is an enlarged layout diagram of a region P of FIG. 1.

FIG. 1 is a layout diagram illustrating an integrated circuit device 100 according to various example embodiments. FIG. 2 is an enlarged layout diagram of a region P of FIG. 1.

Referring to FIGS. 1 and 2, the integrated circuit device 100 may include a semiconductor substrate 110 including a cell array area MCA and a peripheral circuit area PCA. According to some example embodiments, the memory cell array MCA may be distinct from the peripheral circuit area PCA. According to various example embodiments, the semiconductor substrate 110 may include a boundary area BA between the cell array area MCA and the peripheral circuit area PCA.

According to various example embodiments, the cell array area MCA may be or may include a memory cell area of a dynamic random access memory (DRAM) device, and the peripheral circuit area PCA may be a core area or a peripheral circuit area of the DRAM device. For example, the cell array area MCA may include a cell transistor CTR and a capacitor structure (not shown) connected thereto, for example as a one-transistor, one-capacitor (1T1C) DRAM device, and the peripheral circuit area PCA may include a peripheral circuit transistor PTR for transferring a signal and/or power to a cell transistor TR included in the cell array area MCA. In some example embodiments, peripheral circuit transistors PTR may be configured as various circuits such as one or more of a command decoder, a control logic, an address buffer, a row decoder, a column decoder, a sense amplifier, a redundancy decoder, and a data input/output (I/O) circuit. Although FIG. 1 illustrates four cell array areas MCA, example embodiments are not limited thereto.

According to various example embodiments, the boundary area BA may include a boundary structure 114 (see FIG. 4A) configured to electrically insulate the cell array area MCA from the peripheral circuit area PCA.

According to various example embodiments, the semiconductor substrate 110 may include a plurality of active areas ACT and at least one field area F. The plurality of active areas ACT may be arranged in a diagonal direction with respect to a first horizontal direction (an X direction) and a second horizontal direction (a Y direction) intersecting with the first horizontal direction (the X direction). For example, the plurality of active areas ACT and the field area F may be defined by a device isolation layer 112 described below. In some example embodiments the plurality of active areas ACT may have a sausage-shape; however, example embodiments are not limited thereto.

According to various example embodiments, a plurality of word lines WL may cross the plurality of active areas ACT and may extend in parallel in the first horizontal direction (the X direction).

According to various example embodiments, a plurality of bit lines BL may extend in parallel in the second horizontal direction (the Y direction) on the plurality of word lines WL. The plurality of bit lines BL may be connected to the plurality of active areas ACT through a direct contact DC (see FIG. 4T).

Figure 3A:
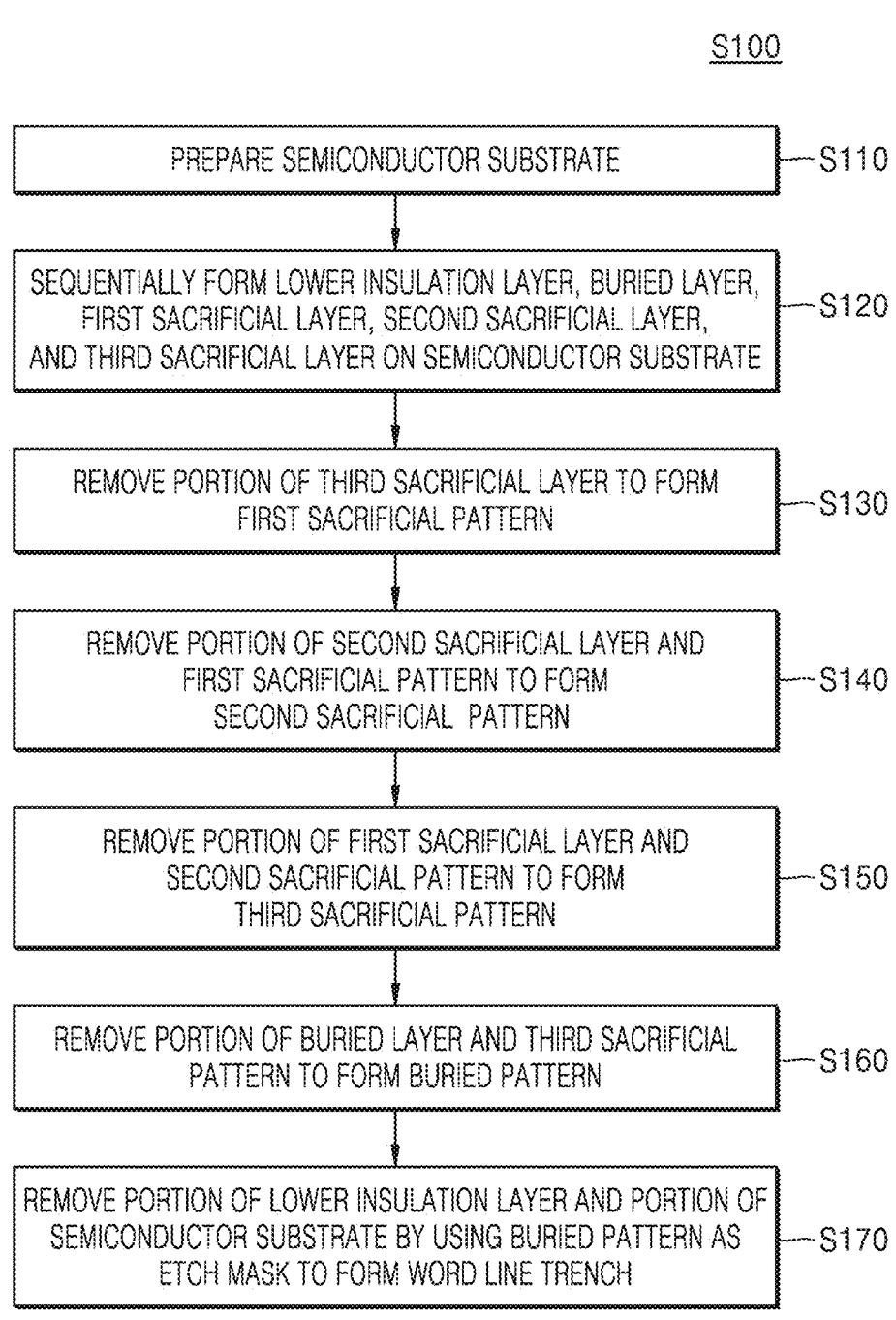
FIG. 3A is a block diagram for describing a method of manufacturing an integrated circuit device, according to various example embodiments.

FIG. 3A is a block diagram for describing a method S100 of manufacturing an integrated circuit device 100, according to various example embodiments. In more detail, FIG. 3A is a block diagram for describing a method of forming a buried channel array transistor (BCAT) of the integrated circuit device 100.

Referring to FIG. 3A, the method S100 of manufacturing an integrated circuit device 100, according to various example embodiments, may include an operation S110 of preparing or provisioning a semiconductor substrate 110, an operation S120 of sequentially forming a lower insulation layer, a buried layer, a first sacrificial layer, a second sacrificial layer, and a third sacrificial layer on the semiconductor substrate 110, an operation S130 of etching a portion of the third sacrificial layer to form a first sacrificial pattern, an operation S140 of etching the first sacrificial pattern and a portion of the second sacrificial layer to form a second sacrificial pattern, an operation S150 of etching the second sacrificial pattern and a portion of the first sacrificial layer to form a third sacrificial pattern, an operation S160 of etching the third sacrificial pattern and a portion of the buried layer to form a buried pattern, and an operation S170 of etching a portion of the lower insulation layer and a portion of the semiconductor substrate by using the buried pattern as an etch mask to form a word line trench.

In a case where example embodiments may be differently implemented, one or more certain process sequences may be performed unlike a described sequence. For example, two processes continuously described may be performed substantially simultaneously or at least partially overlapping, or may be performed in sequence opposite to a described sequence.

Technical features of each of the first to seventh operations S110 to S170 will be described in detail with reference to FIGS. 4A to 4T, 5A, 5B, and 6.

FIGS. 4A to 4T are cross-sectional views illustrating cross-sectional surfaces taken along line A-A' and line B-B' of FIG. 2 in a process sequence for describing a method S100 of manufacturing an integrated circuit device 100, according to various example embodiments. In detail, FIGS. 4A to 4T are cross-sectional views of a method of forming a word line trench in the method S100 of manufacturing the integrated circuit device 100, according to various example embodiments.

Referring to FIG. 4A, a semiconductor substrate 110 may be prepared in operation S110. According to various example embodiments, the semiconductor substrate 110 may include a cell array area MCA, a peripheral circuit area PCA, and a boundary area BA between the cell array area MCA and the peripheral circuit area PCA. For example, the boundary area BA may surround the cell array area MCA in a horizontal direction (an X direction and/or a Y direction), and the peripheral circuit area PCA may surround the boundary area BA in the horizontal direction (the X direction and/or the Y direction).

According to various example embodiments, a device isolation trench 112T may be formed, e.g. may be etched, in the semiconductor substrate 110, and a device isolation layer 112 may be formed, e.g. may be deposited, in the device isolation trench 112T. A plurality of active areas ACT may be defined in the semiconductor substrate 110 in the cell array area MCA by the device isolation layer 112. In a plan view, the device isolation layer 112 may be defined as a field area F.

According to various example embodiments, the semiconductor substrate 110 may include silicon (for example, one or more of single crystal silicon, poly-crystal silicon, or amorphous silicon). Alternatively or additionally, the semiconductor substrate 110 may include at least one selected from among germanium (Ge), silicon germanium (SiGe), silicon carbide (SiC), gallium arsenide (GaAs), indium arsenide (InAs), and indium phosphide (InP). In some example embodiments, the semiconductor substrate 110 may include a conductive region (for example, an impurity-doped well or an impurity-doped structure). According to various example embodiments, the device isolation layer 112 may include oxide, nitride, or a combination thereof.

According to various example embodiments, a boundary trench 114T may be formed in the boundary area BA between the cell array area MCA and the peripheral circuit area PCA, and a boundary structure 114 may be formed in the boundary trench 114T. According to various example embodiments, the boundary structure 114 may include a buried insulation layer 114a, an insulation liner 114b, and a gap-fill insulation layer 114c, which are disposed in the boundary trench 114T.

According to various example embodiments, the buried insulation layer 114a may be conformally disposed on an inner wall of the boundary trench 114T. In some example embodiments, the buried insulation layer 114a may include silicon oxide. For example, the buried insulation layer 114a may include silicon oxide formed by one or more of an atomic layer deposition (ALD) process, a chemical vapor deposition (CVD) process, a plasma enhancement CVD (PECVD) process, or a low pressure CVD (LPCVD) process.

According to various example embodiments, the insulation liner 114b may be conformally disposed on the inner wall of the boundary trench 114T, on the buried insulation layer 114a. In some example embodiments, the insulation liner 114b may include silicon nitride. For example, the insulation liner 114b may include silicon nitride formed by one or more of an ALD process, a CVD process, a PECVD process, or an LPCVD process, e.g. by the same, or different, processes used to form the buried insulation layer 114a.

The gap-fill insulation layer 114c may fill an inner portion of the boundary trench 114T, on the insulation liner 114b. In some example embodiments, the gap-fill insulation layer 114c may include silicon oxide such as tonen silazene (TOSZ), undoped silicate glass (USG), boro-phospho-silicate glass (BPSG), phosphosilicate glass (PSG), flowable oxide (FOX), plasma enhanced deposition of tetra-ethyl-ortho-silicate (PE-TEOS), or fluoride silicate glass (FSG).

Referring to FIG. 4B, a lower insulation layer 122, a buried layer 124, a first sacrificial layer 130, a second sacrificial layer 140, and a third sacrificial layer 150 may be sequentially formed on the semiconductor substrate 110 in operation S120.

According to various example embodiments, the lower insulation layer 122 may include at least one material of silicon oxide, silicon nitride, and silicon oxynitride. In some example embodiments, the lower insulation layer 122 may be a single layer including silicon oxide. In some example embodiments, the lower insulation layer 122 may be a multilayer. For example, the lower insulation layer 122 may be a multilayer including two or more layers, and each layer configuring the multilayer may include one or more materials of silicon oxide, silicon nitride, and silicon oxynitride. According to various example embodiments, the lower insulation layer 122 may be formed on the semiconductor substrate 110 by one or more of an ALD process, a CVD process, a PECVD process, or an LPCVD process.

According to various example embodiments, the buried layer 124 may include an amorphous carbon layer (ACL) or a spin-on hardmask. For example, the spin-on hardmask may be a carbon based spin-on hardmask (C-SOH). According to various example embodiments, the buried layer 124 may be formed by depositing the ACL on the lower insulation layer 122 through one or more of an ALD process, a CVD process, a PECVD process, or an LPCVD process. According to various example embodiments, the buried layer 124 may include a single layer including an ACL. In some example embodiments, the buried layer 124 may include a carbon-based multilayer.

According to various example embodiments, the first sacrificial layer 130 including polysilicon may be formed on the buried layer 124. According to various example embodiments, the first sacrificial layer 130 may be formed by one or more of an ALD process, a CVD process, a PECVD process, or an LPCVD process. According to various example embodiments, the first sacrificial layer 130 may be formed as a single layer. According to various example embodiments, the first sacrificial layer 130 may have an etch selectivity with respect to the buried layer 124 and the second sacrificial layer 140. For example, a separate layer used as an etch stop layer may not be formed between the first sacrificial layer 130 and the buried layer 124 and between the first sacrificial layer 130 and the second sacrificial layer 140.

According to various example embodiments, the second sacrificial layer 140 may include a first lower sacrificial layer 142 and a first upper sacrificial layer 144. For example, the first lower sacrificial layer 142 and the first upper sacrificial layer 144 may be sequentially formed on the first sacrificial layer 130. According to various example embodiments, the first lower sacrificial layer 142 and the first upper sacrificial layer 144 may each have an etch selectivity with respect to each other. For example, each of the first lower sacrificial layer 142 and the first upper sacrificial layer 144 may include one or more material selected from among silicon oxide, silicon nitride, silicon oxynitride, and a spin-on hardmask film. For example, the first lower sacrificial layer 142 may include a single layer including a spin-on hardmask film, and the first upper sacrificial layer 144 may include a single layer including silicon oxynitride. According to various example embodiments, the first upper sacrificial layer 144 may be formed on the first lower sacrificial layer 142 by one or more of an ALD process, a CVD process, a PECVD process, or an LPCVD process.

According to various example embodiments, the third sacrificial layer 150 may include a second lower sacrificial layer 152 and a second upper sacrificial layer 154. For example, the second lower sacrificial layer 152 and the second upper sacrificial layer 154 may be sequentially formed on the second sacrificial layer 140. According to various example embodiments, the second lower sacrificial layer 152 and the second upper sacrificial layer 154 may each have an etch selectivity with respect to each other. For example, each of the second lower sacrificial layer 152 and the second upper sacrificial layer 154 may include one or more material selected from among silicon oxide, silicon nitride, silicon oxynitride, and a spin-on hardmask. For example, the second lower sacrificial layer 152 may include a single layer including a spin-on hardmask, and the second upper sacrificial layer 154 may include a single layer including silicon oxynitride. According to various example embodiments, the second upper sacrificial layer 154 may be formed on the second lower sacrificial layer 152 by one or more of an ALD process, a CVD process, a PECVD process, or an LPCVD process.

Figure 4C:
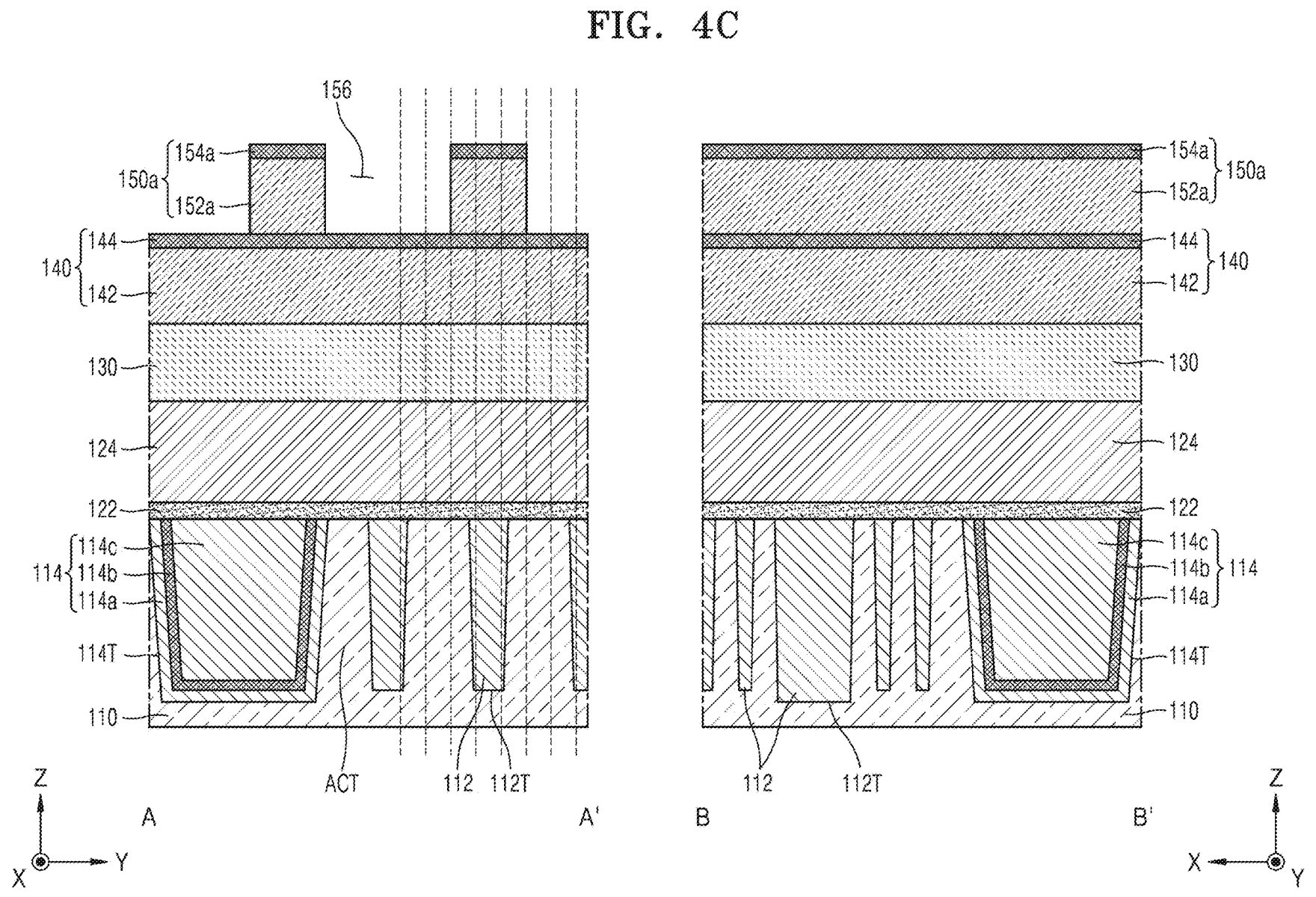

Referring to FIG. 4C, a first sacrificial pattern 150a may be formed by etching (e.g. anisotropically and/or isotropically etching) a portion of the third sacrificial layer 150. According to various example embodiments, a pattern mask (not shown) may be formed on the third sacrificial layer 150, and then, the first sacrificial pattern 150a may be formed by removing a portion of the third sacrificial layer 150 by using the pattern mask (not shown) as an etch mask. For example, a portion of the third sacrificial layer 150 may be removed by a dry etching process. According to various example embodiments, the first sacrificial pattern 150a may include a first lower sacrificial pattern 152a and a first upper sacrificial pattern 154a.

According to various example embodiments, the second sacrificial layer 140 may be exposed through a first sacrificial pattern opening portion 156 defined by the first sacrificial pattern 150a. For example, a portion of an upper surface of the first upper sacrificial layer 144 may be exposed. For example, the first upper sacrificial layer 144 may be used as an etch stop layer when performing an etching process of forming the first sacrificial pattern 150a.

Referring to FIGS. 4D to 4G, a second sacrificial pattern 140a may be formed by etching a portion of each of the first sacrificial pattern 150a and the second sacrificial layer 140 in operation S140.

Referring back to FIG. 3B, FIG. 3B is a block diagram for describing the method S100 of manufacturing the integrated circuit device 100, according to various example embodiments. In more detail, FIG. 3B is a block diagram for describing the fourth operation S140 of the method S100 of manufacturing the integrated circuit device 100, according to various example embodiments. Hereinafter, FIG. 3B will be described with reference to FIGS. 4D to 4G.

Figure 4D:
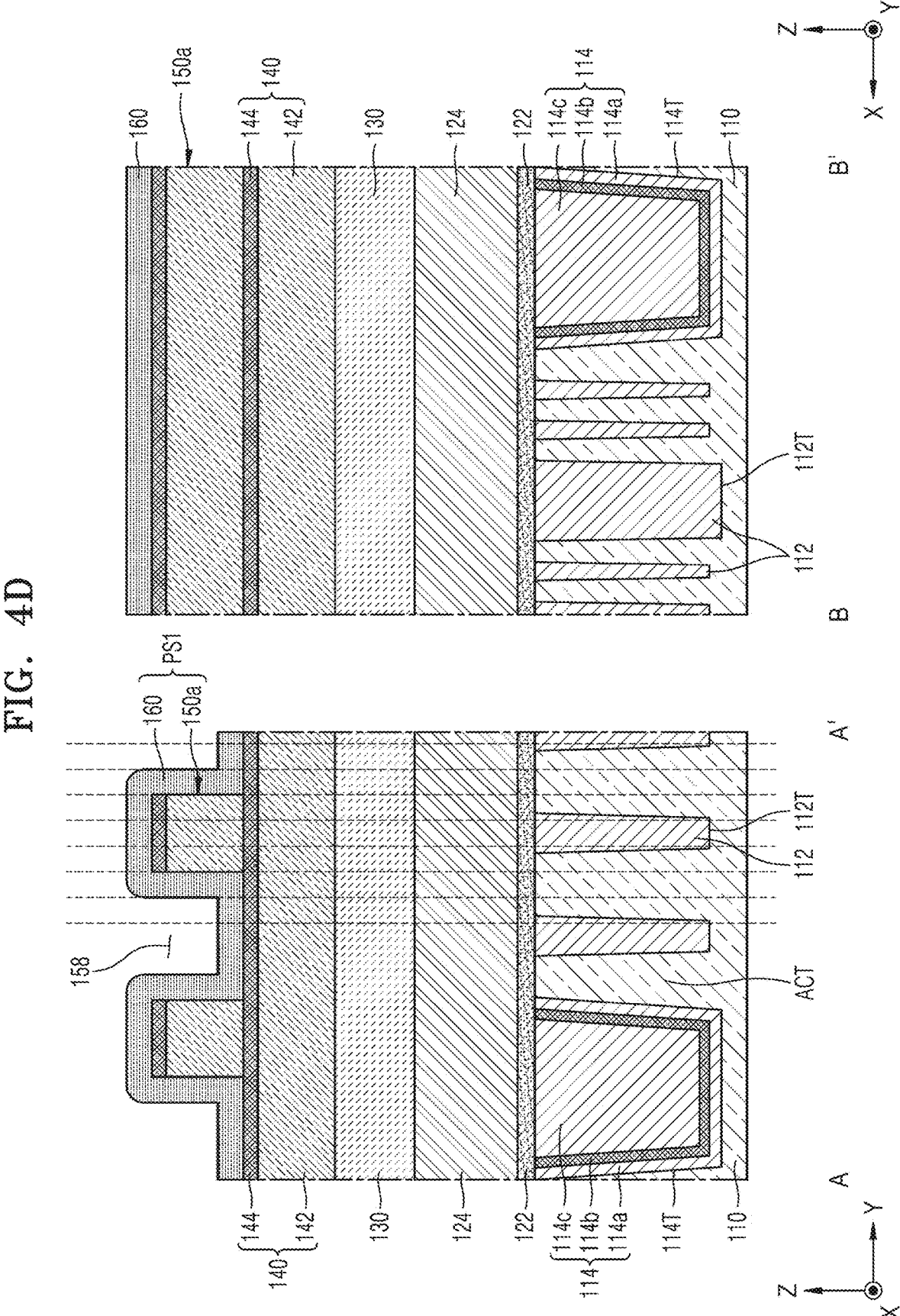
FIGS. 4A to 4T are cross-sectional views illustrating cross-sectional surfaces taken along line A-A' and line B-B' of FIG. 2 in a process sequence for describing a method of manufacturing an integrated circuit device, according to various example embodiments.

Referring to FIG. 4D, a first mask layer 160 conformally covering the first sacrificial pattern 150a and the exposed second sacrificial layer 140 may be formed in operation S141

According to various example embodiments, the first mask layer 160 may cover, e.g., may conformally cover an upper surface of the first sacrificial pattern 150a, both sidewalls of the first sacrificial pattern 150a, and an upper surface of the exposed second sacrificial layer 140. According to various example embodiments, a first trench 158 limited or defined by the first mask layer 160 covering both sidewalls of the first sacrificial pattern 150a and the upper surface of the second sacrificial layer 140 may be formed. For example, a plurality of first trenches 158 may extend in a first horizontal direction (an X direction) and may be formed in parallel in a second horizontal direction (a Y direction).

According to various example embodiments, the first mask layer 160 may include oxide such as one or more of TOSZ, USG, BPSG, PSG, FOX, PE-TEOS, or FSG. According to various example embodiments, the first mask layer 160 may be formed by an ALD process and/or a conformal deposition process such as a plasma-enhanced CVD (PECVD) process.

Figure 4E:
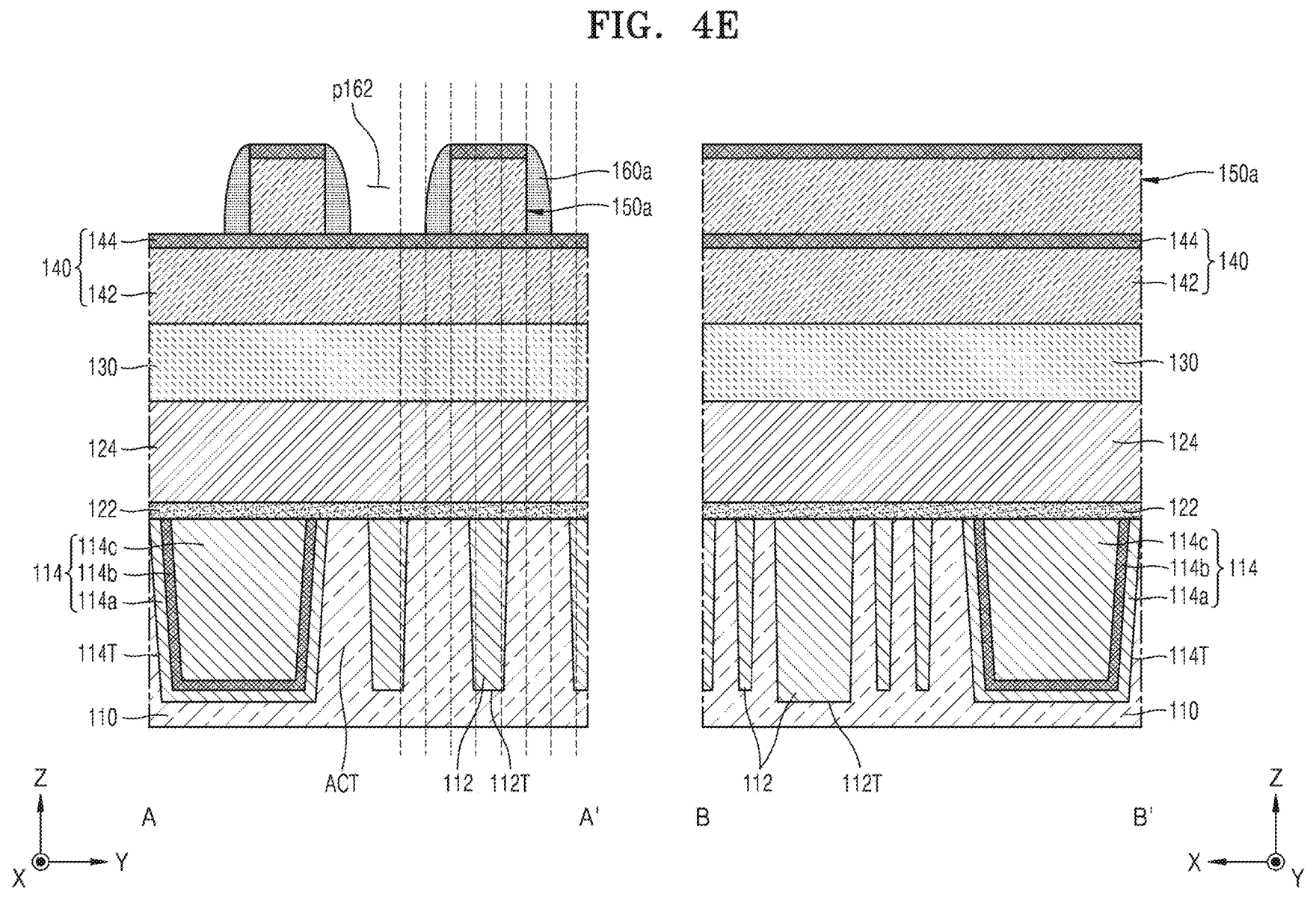

Referring to FIG. 4E, a first mask pattern 160a may be formed by removing a portion of the first mask layer 160, and thus, the first sacrificial pattern 150a and the second sacrificial layer 140 may be exposed in operation S142. According to various example embodiments, operation S142 of forming the first mask pattern 160a may be formed by a dry etching process such as a reactive ion etching (RIE) process; however, example embodiments are not limited thereto.

Referring to FIGS. 4D and 4E, a portion of the first mask layer 160 covering an upper surface of the second sacrificial layer 140 and a portion of the first mask layer 160 covering an upper surface of the first sacrificial pattern 150a may be removed, and thus, a first preliminary mask pattern opening portion p162 may be formed. Therefore, the first sacrificial pattern 150a and the second sacrificial layer 140 may be exposed. According to various example embodiments, a first pattern structure PS1 including the first sacrificial pattern 150a and the first mask pattern 160a covering sidewalls, e.g. both sidewalls shown in cross-section, of the first sacrificial pattern 150a may be formed.

According to various example embodiments, a plurality of first pattern structures PS1 may extend in the first horizontal direction (the X direction). According to various example embodiments, the plurality of first pattern structures PS1 may be formed in parallel in the second horizontal direction (the Y direction).

Figure 4F:
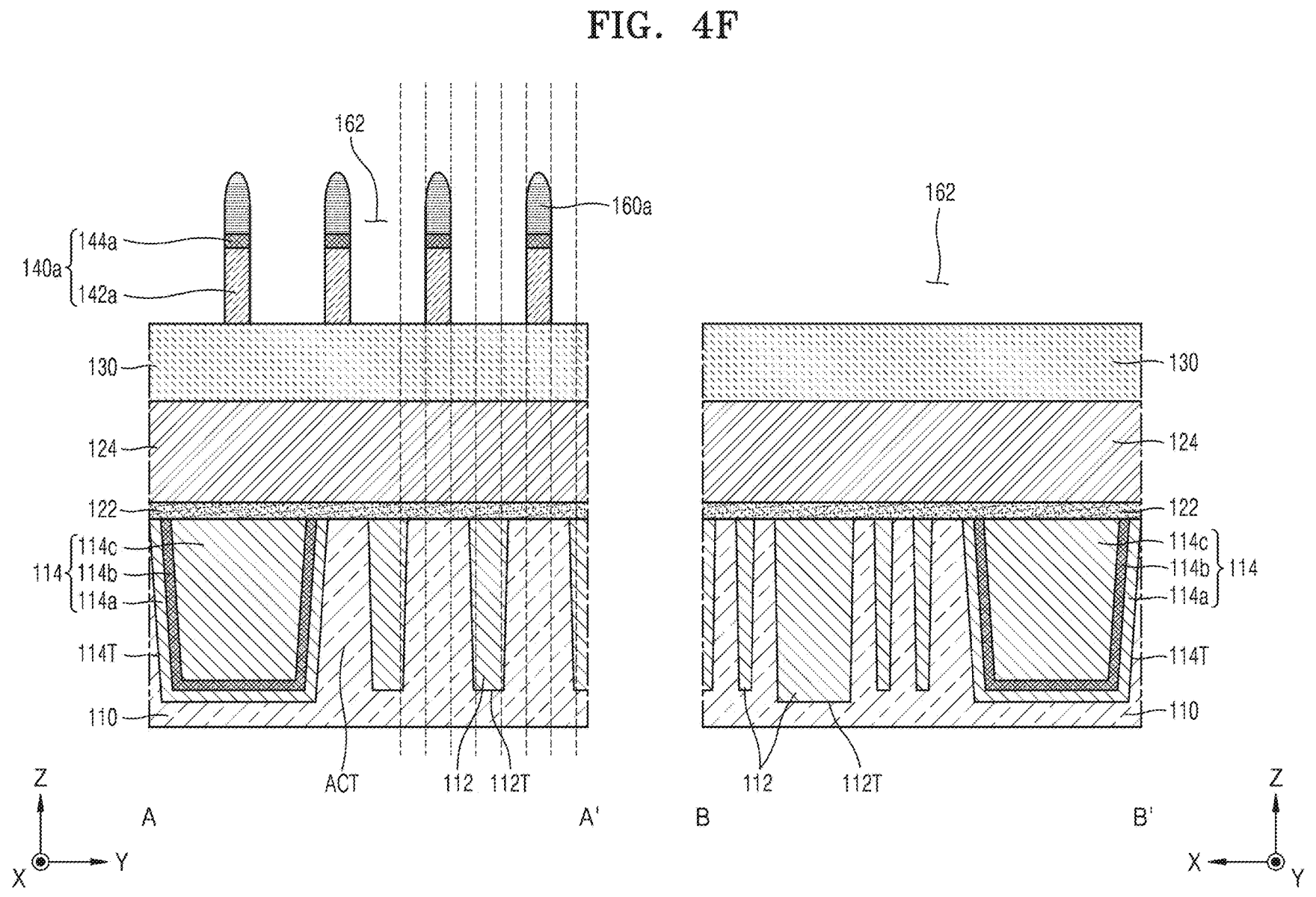

Referring to FIGS. 4E and 4F, a second sacrificial pattern 140a may be formed by removing all or a portion of the first sacrificial pattern 150a and all or a portion of the second sacrificial layer 140 by using the first mask pattern 160a as an etch mask in operation S143.

According to various example embodiments, the first sacrificial pattern 150a of the first pattern structure PS1 may be removed, and thus, all or a portion of the second sacrificial layer 140 overlapping the first sacrificial pattern 150a in a vertical direction (a Z direction) may be exposed. Therefore, both sidewalls of the first mask pattern 160a may be exposed. Subsequently, a portion of the second sacrificial layer 140 may be removed by using the first mask pattern 160a as an etch mask, and thus, the second sacrificial pattern 140a may be formed. A first mask pattern opening portion 162 defined by the second sacrificial pattern 140a and the first mask pattern 160a on the second sacrificial pattern 140a may be formed. For example, the first sacrificial layer 130 may be exposed through the first mask pattern opening portion 162. For example, a process of forming the second sacrificial pattern 140a may be performed by a dry etching process such as but not limited to an RIE process.

Figure 4G:
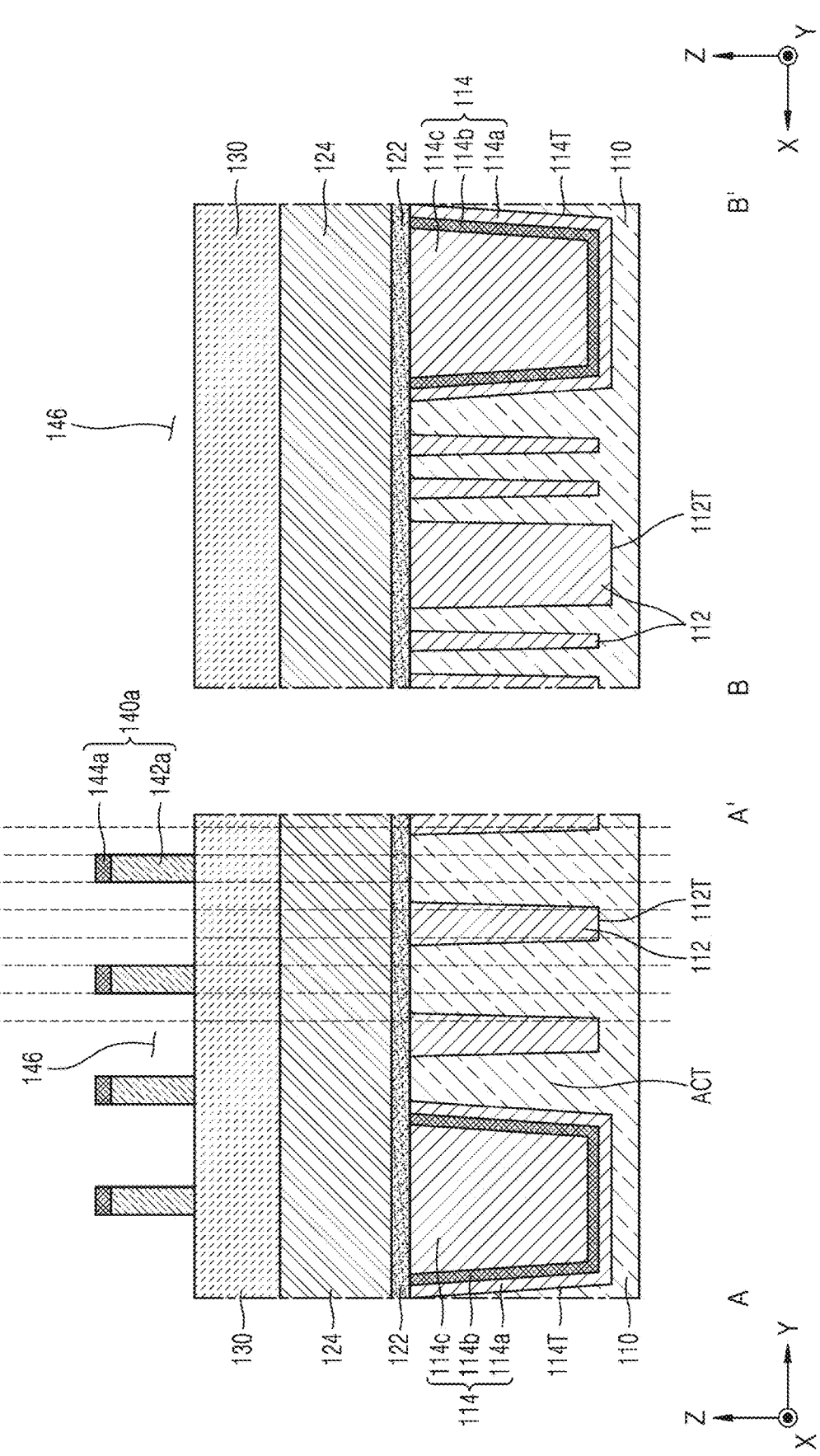

Referring to FIGS. 4F and 4G, the first mask pattern 160a on the second sacrificial pattern 140a may be removed in operation S144. Therefore, a second sacrificial pattern opening portion 146 which is defined by the second sacrificial pattern 140a and exposes the first sacrificial layer 130 may be formed. According to various example embodiments, the second sacrificial pattern 140*a* may include a second lower sacrificial pattern 142*a* and a second upper sacrificial pattern 144*a*.

Referring to FIGS. 4H to 4L, a third sacrificial pattern 130*a* may be formed by etching, e.g. dry etching, a portion of each of the second sacrificial pattern 140*a* and the first sacrificial layer 130 in operation S150.

Referring back to FIG. 3C, FIG. 3C is a block diagram for describing the method S100 of manufacturing the integrated circuit device 100, according to various example embodiments. In more detail, FIG. 3C is a block diagram for describing the fifth operation S150 of the method S100 of manufacturing the integrated circuit device 100, according to various example embodiments. Hereinafter, FIG. 3C will be described with reference to FIGS. 4H to 4L.

Figure 4H:
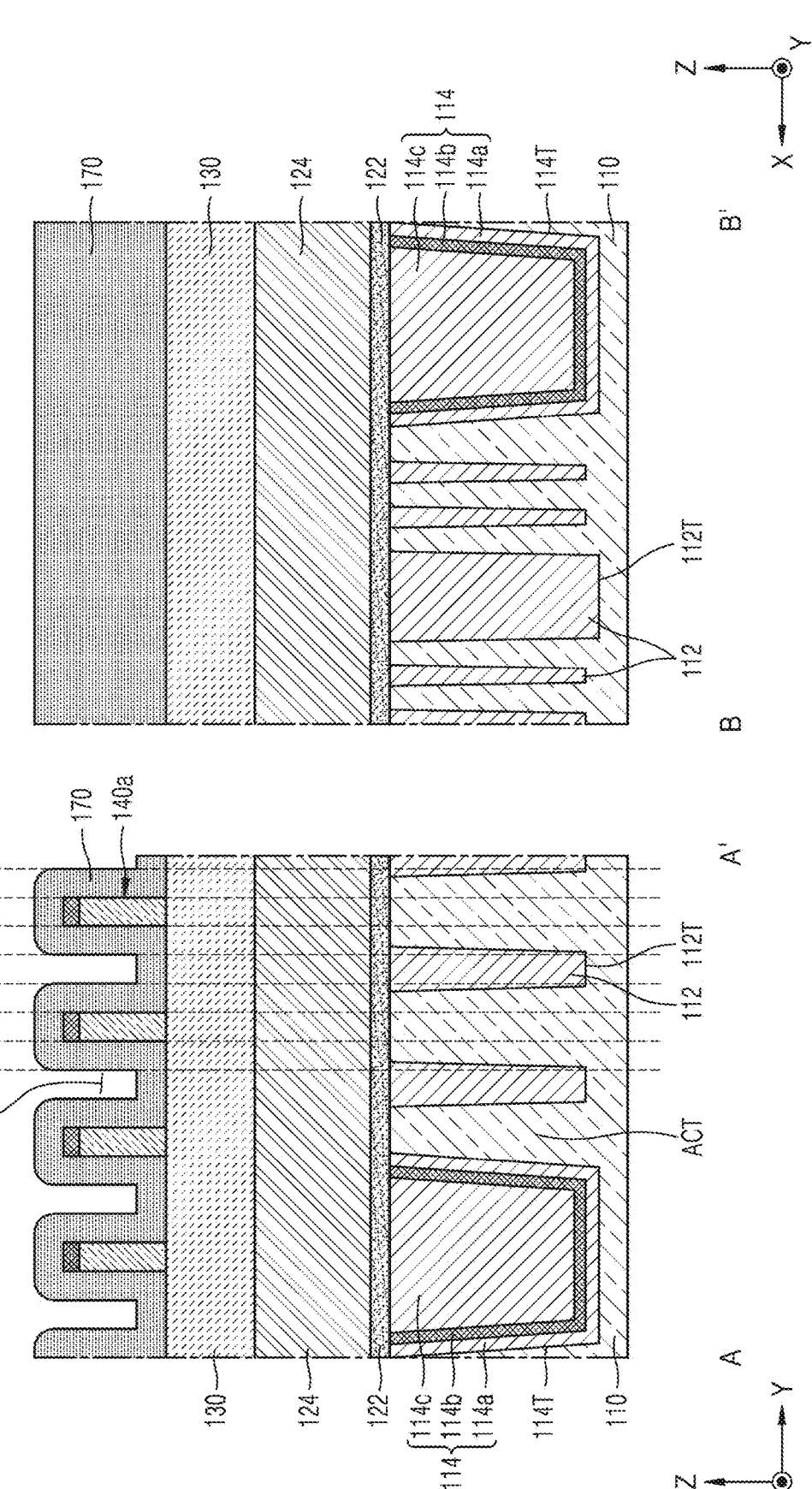

Referring to FIG. 4H, a second mask layer 170 covering or conformally covering the second sacrificial pattern 140*a* and the exposed first sacrificial layer 130 may be formed in operation S151.

According to various example embodiments, the second mask layer 170 may cover, e.g. conformally cover an upper surface of the second sacrificial pattern 140*a*, both sidewalls of the second sacrificial pattern 140*a*, and an upper surface of the exposed first sacrificial layer 130. According to various example embodiments, a second trench 148 limited or defined by the second mask layer 170 covering both sidewalls of the second sacrificial pattern 140*a* and the upper surface of the first sacrificial layer 130 may be formed. For example, a plurality of second trenches 148 may extend in the first horizontal direction (the X direction) and may be formed in parallel in the second horizontal direction (the Y direction).

According to various example embodiments, the second mask layer 170 may include oxide such as one or more of TOSZ, USG, BPSG, PSG, FOX, PE-TEOS, or FSG. According to various example embodiments, the second mask layer 170 may be formed by an ALD process.

Figure 4I:
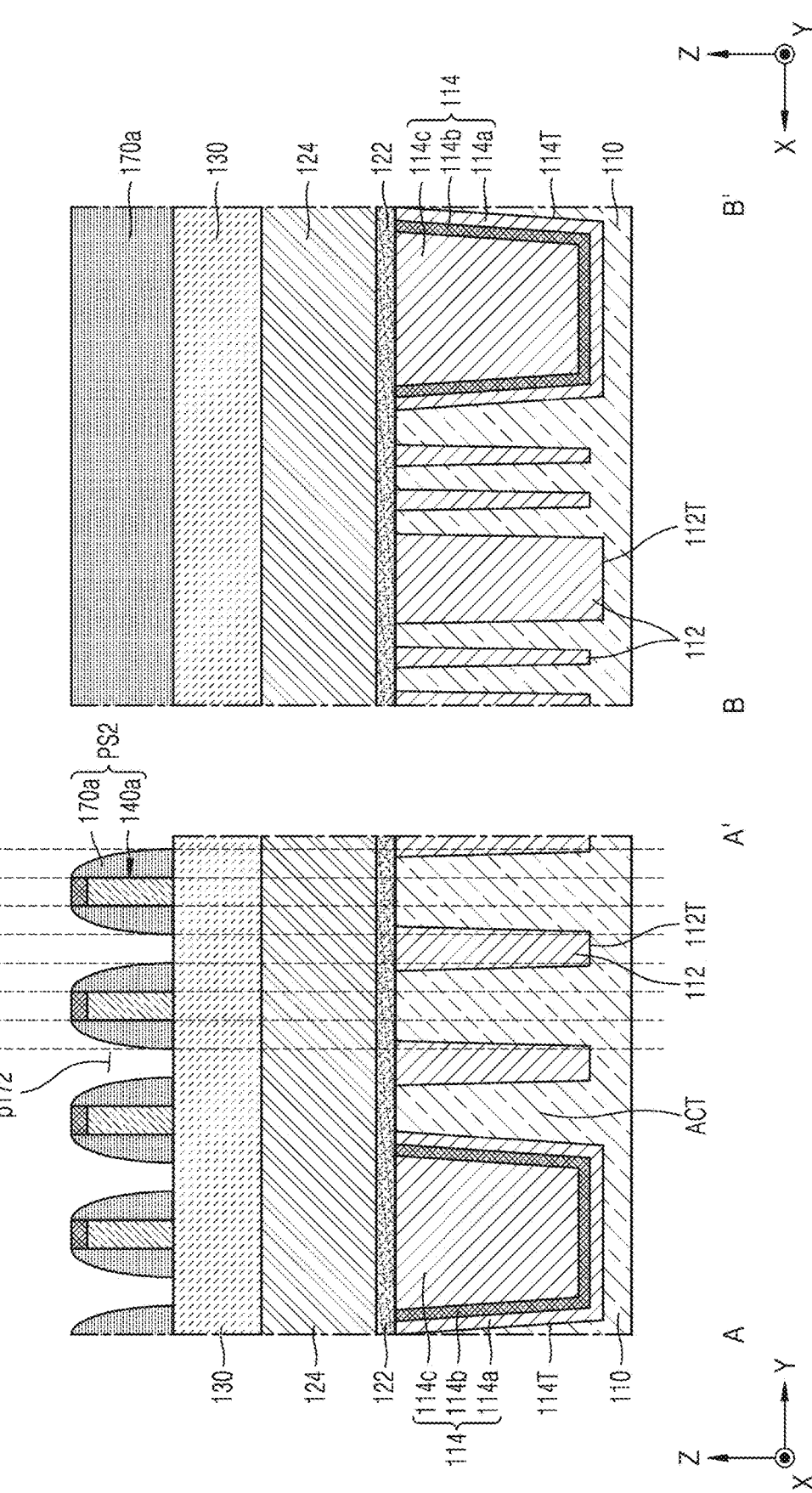

Referring to FIG. 4I, a second mask pattern 170*a* may be formed by removing a portion of the second mask layer 170. Therefore, the second sacrificial pattern 140*a* and the first sacrificial layer 130 may be exposed in operation S152. According to various example embodiments, operation S152 of forming the second mask pattern 170*a* may be formed by a dry etching process.

Referring to FIGS. 4H and 4I, a portion of the second mask layer 170 covering an upper surface of the first sacrificial layer 130 and a portion of the second mask layer 170 covering an upper surface of the second sacrificial pattern 140*a* may be removed, and thus, a second preliminary mask pattern opening portion p172 may be formed. Therefore, the second sacrificial pattern 140*a* and the first sacrificial layer 130 may be exposed. According to various example embodiments, a second pattern structure PS2 including the second sacrificial pattern 140*a* and the second mask pattern 170*a* covering both sidewalls of the second sacrificial pattern 140*a* may be formed.

According to various example embodiments, a plurality of second pattern structures PS2 may extend in the first horizontal direction (the X direction). According to various example embodiments, the plurality of second pattern structures PS2 may be formed in parallel in the second horizontal direction (the Y direction).

Figure 4J:
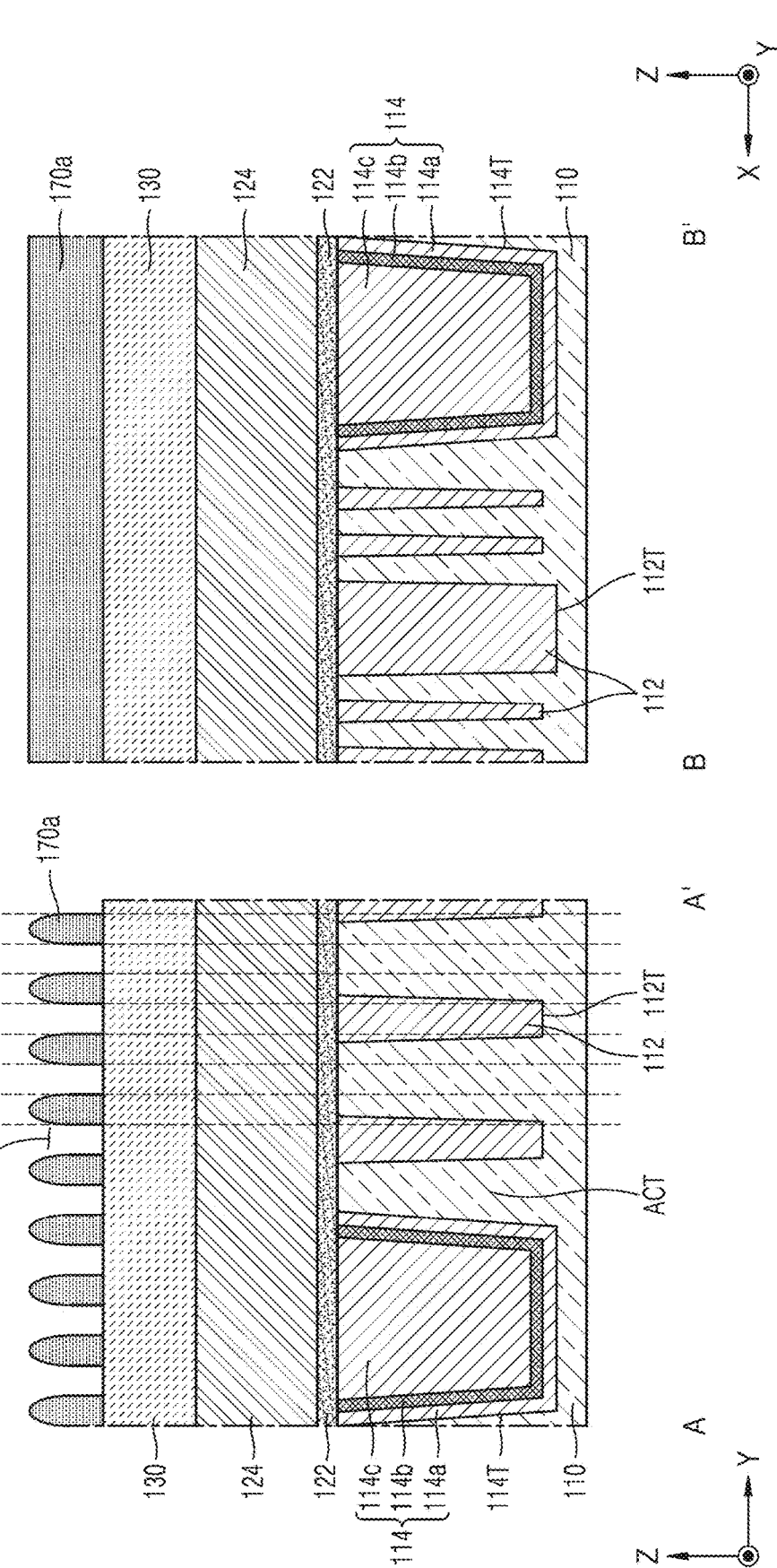

Referring to FIGS. 4I and 4J, the exposed second sacrificial pattern 140*a* may be removed in operation S153. According to various example embodiments, the second sacrificial pattern 140*a* of the second pattern structure PS2 may be removed, and thus, both sidewalls of the second mask pattern 170*a* may be exposed. Therefore, a second mask pattern opening portion 172 defined by the second mask pattern 170*a* may be formed. In this case, the first sacrificial layer 130 overlapping the second sacrificial pattern 140*a* in the vertical direction (the Z direction) may be exposed. According to various example embodiments, the second sacrificial pattern 140*a* and the first sacrificial layer 130 may each have an etch selectivity with respect to each other.

Figure 4K:
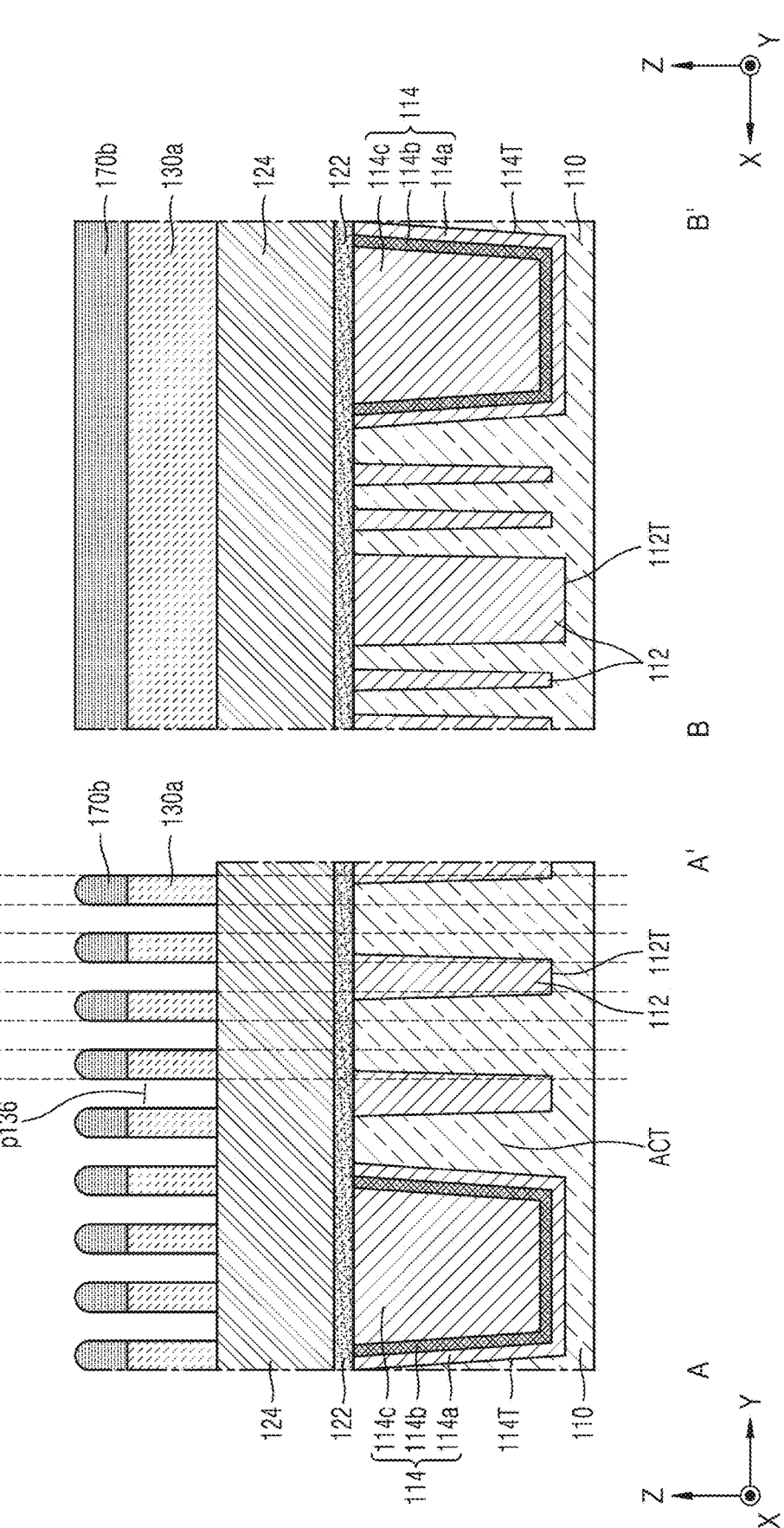

Referring to FIGS. 4J and 4K, the third sacrificial pattern 130*a* may be formed by etching a portion of the first sacrificial layer 130 by using the second mask pattern 170*a* as an etch mask in operation S154. In this step, a portion of the second mask pattern 170*a* may be removed, and thus, a residual mask pattern 170*b* may be formed. According to various example embodiments, a third preliminary sacrificial pattern opening portion p136 defined by the third sacrificial pattern 130*a* and the residual mask pattern 170*b* may be formed, and an upper surface of the buried layer 124 may be exposed through the third preliminary sacrificial pattern opening portion p136.

Referring to FIGS. 4K and 4L, the residual mask pattern 170*b* on the third sacrificial pattern 130*a* may be removed in operation S155.

According to various example embodiments, a cleaning process may be performed on the semiconductor substrate 110. According to various example embodiments, after the third preliminary sacrificial pattern opening portion p136 is formed, hydrogen fluoride (HF) or and/or buffered HF treatment may be performed on the semiconductor substrate 110, and thus, the residual mask pattern 170*b* may be removed. For example, the residual mask pattern 170*b* may be removed by a wet cleaning process. Therefore, a third sacrificial pattern opening portion 136 defined by the third sacrificial pattern 130*a* may be formed. For example, the buried layer 124 may be exposed through the third sacrificial pattern opening portion 136.

In some embodiments, a wet cleaning process using HF may be performed in operation S144 of removing the first mask pattern 160*a* described above.

Referring to FIGS. 4M to 4Q, a buried pattern 120*a* may be formed by etching a portion of each of the third sacrificial pattern 130*a* and the buried layer 124 in operation S160.

FIG. 3D is a block diagram for describing the method S100 of manufacturing the integrated circuit device 100, according to various example embodiments. In more detail, FIG. 3D is a block diagram for describing the sixth operation S160 of the method S100 of manufacturing the integrated circuit device 100, according to various example embodiments. Hereinafter, FIG. 3D will be described with reference to FIGS. 4M to 4Q.

Referring to FIG. 4M, a third mask layer 180 conformally covering the third sacrificial pattern 130*a* and the exposed buried layer 124 may be formed in operation S161.

According to various example embodiments, the third mask layer 180 may conformally cover an upper surface of the third sacrificial pattern 130*a*, both sidewalls of the third sacrificial pattern 130*a*, and an upper surface of the exposed buried layer 124. According to various example embodiments, the third mask layer 180 may fill the third sacrificial pattern opening portion 136.

Figure 4N:
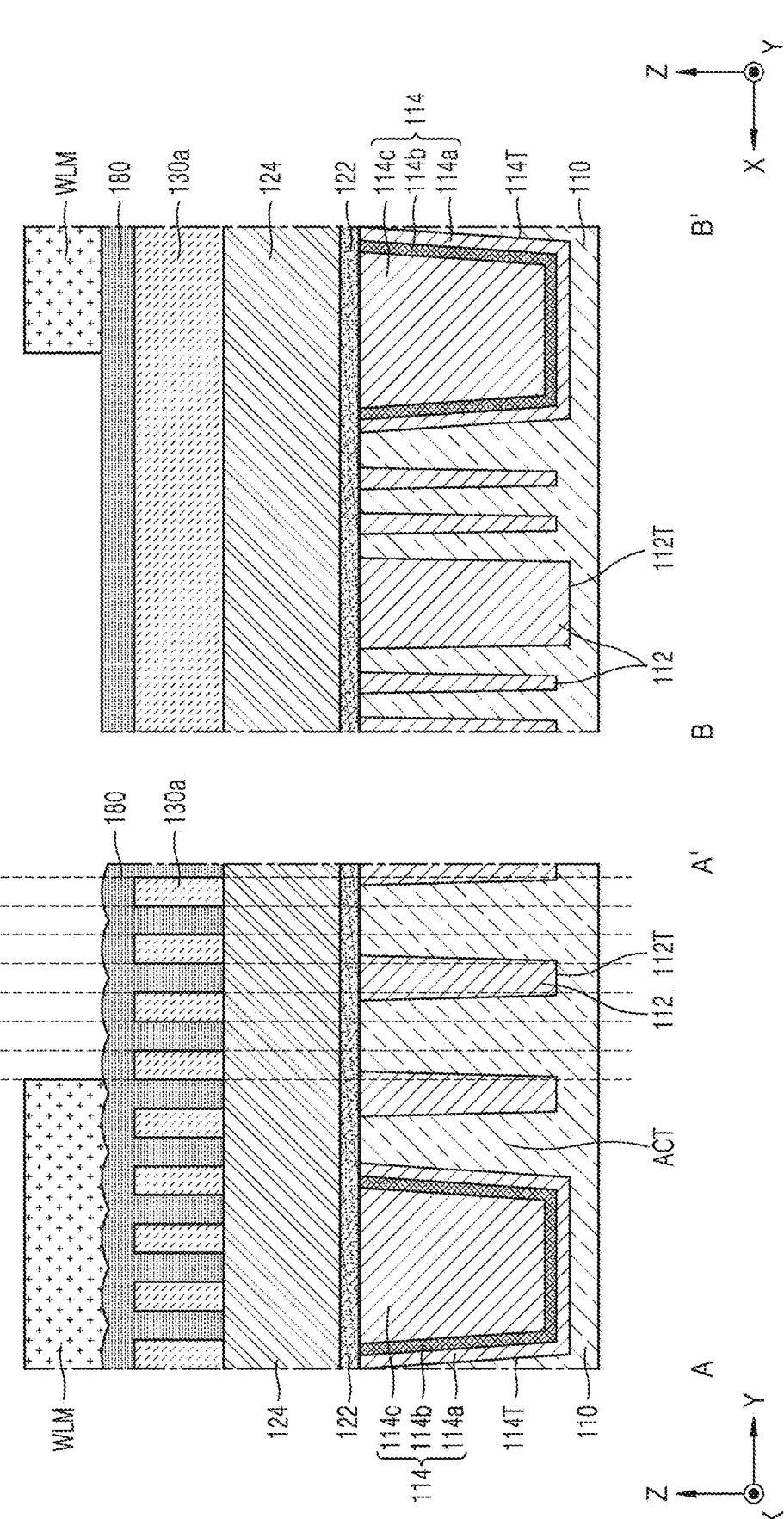
Figure 40:
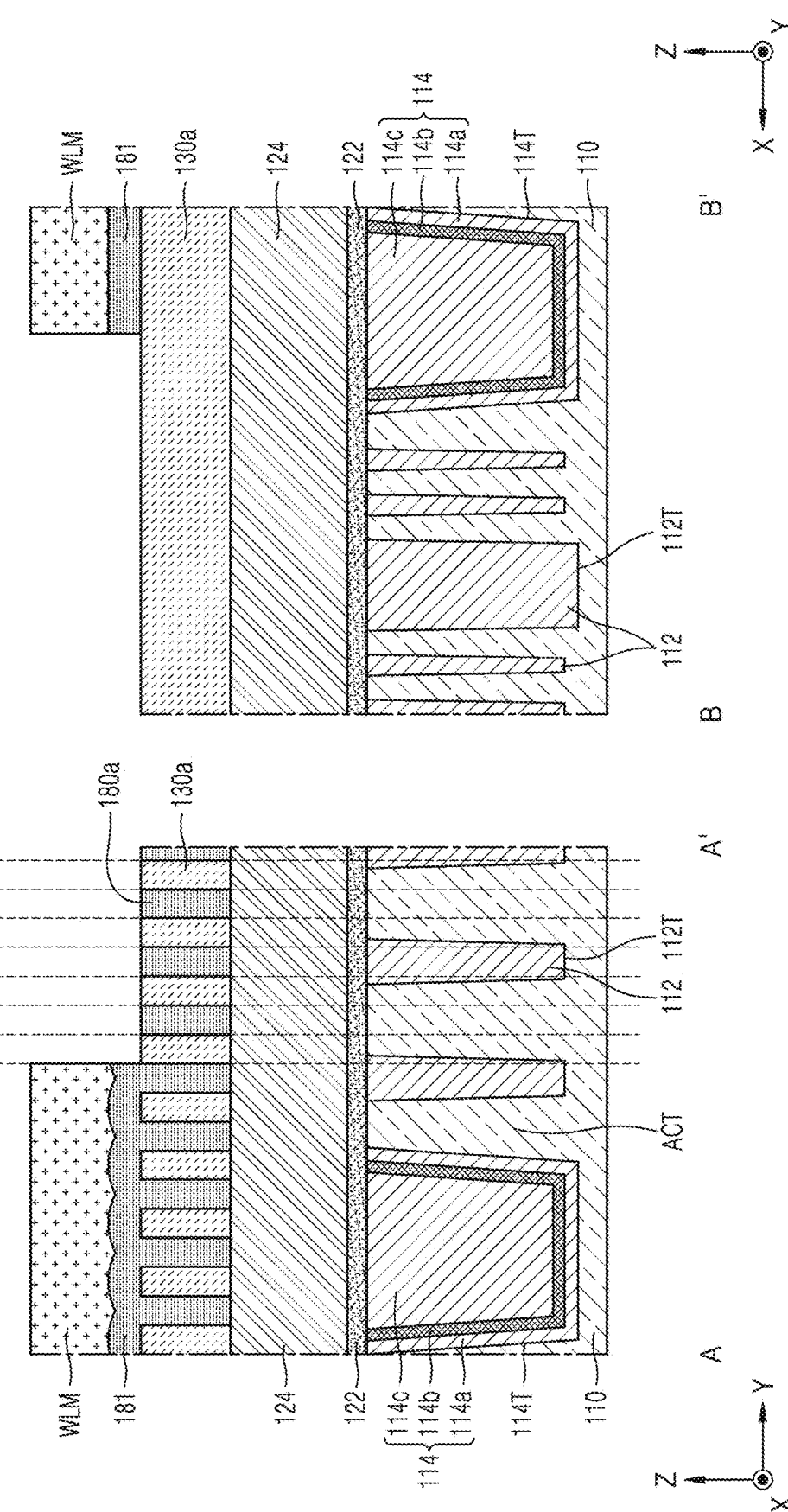

Referring to FIG. 4N, a word line mask WLM exposing a cell array area MCA may be formed on the third mask layer 180 in operation S162.

Figure 6:
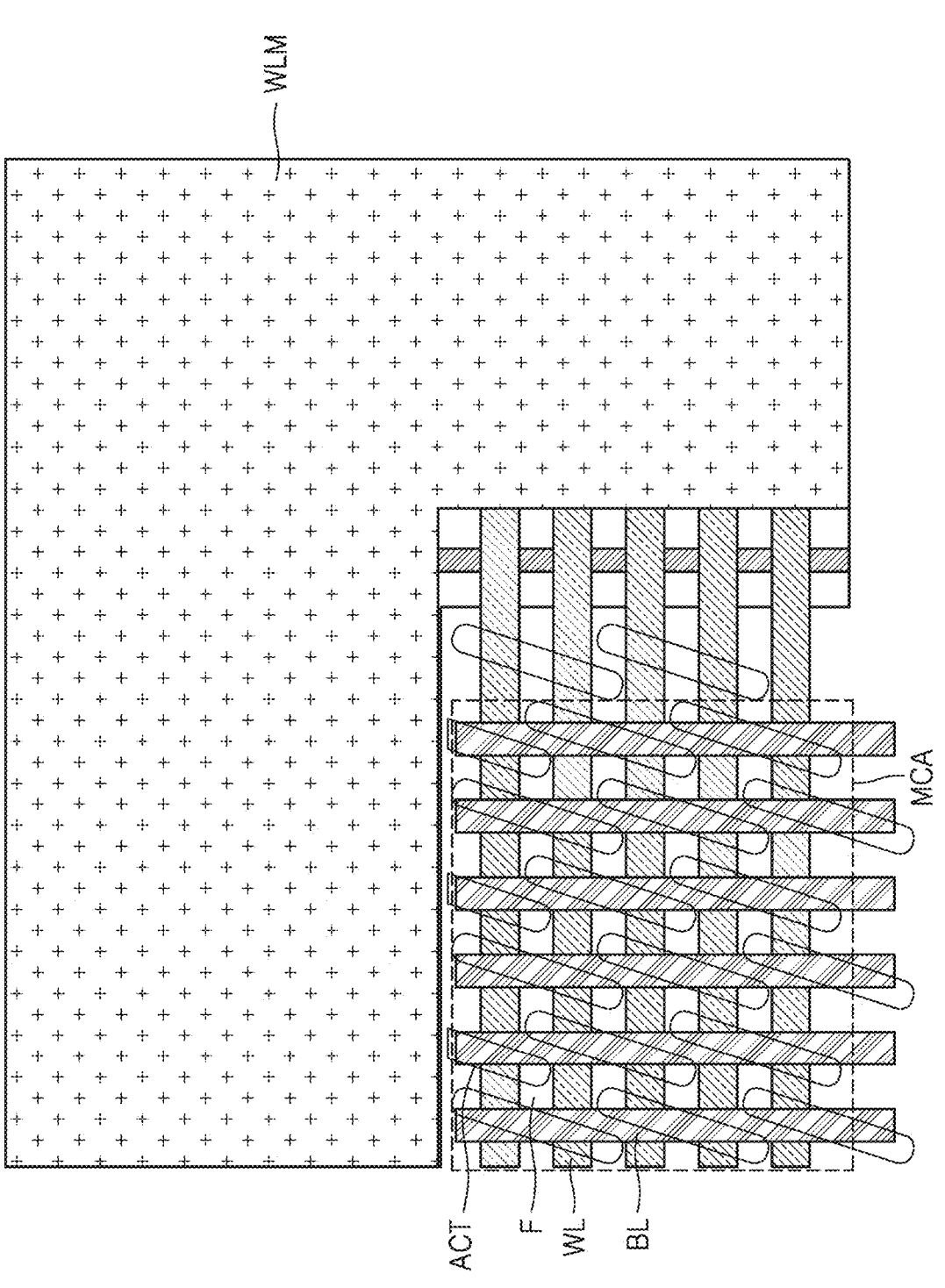
FIG. 6 is an enlarged layout diagram of a region P of FIG. 1 for describing a method of manufacturing an integrated circuit device, according to various example embodiments.

FIG. 6 is an enlarged layout diagram of a region P of FIG. 1 for describing the method S100 of manufacturing the integrated circuit device 100, according to various example embodiments. In more detail, FIG. 6 is an enlarged layout diagram of the region P of FIG. 1 for describing an arrangement structure of a word line mask WLM in the sixth operation S160 of the method S100 of manufacturing the integrated circuit device 100, according to various example embodiments.

Referring to FIGS. 4N and 6, the word line mask WLM may cover an upper surface of the other region, except a region where a plurality of word lines WL are arranged, of an upper surface of the semiconductor substrate 110.

Referring to FIG. 4O, a third mask pattern 180a may be formed by partially removing the exposed third mask layer 180, and thus, the third sacrificial pattern 130a may be exposed in operation S163. According to various example embodiments, the operation S163 may be performed by a dry etching process of partially removing the third mask layer 180. For example, the third sacrificial pattern 130a may be exposed through an etch-back process.

According to various example embodiments, the third sacrificial pattern 130a and the third mask pattern 180a may intersect with each other in the second horizontal direction (the Y direction) and may extend in parallel. According to various example embodiments, the buried layer 124 may overlap the third sacrificial pattern 130a and the third mask pattern 180a in the vertical direction (the Z direction), in a region thereof exposed by the word line mask WLM.

Figure 4P:
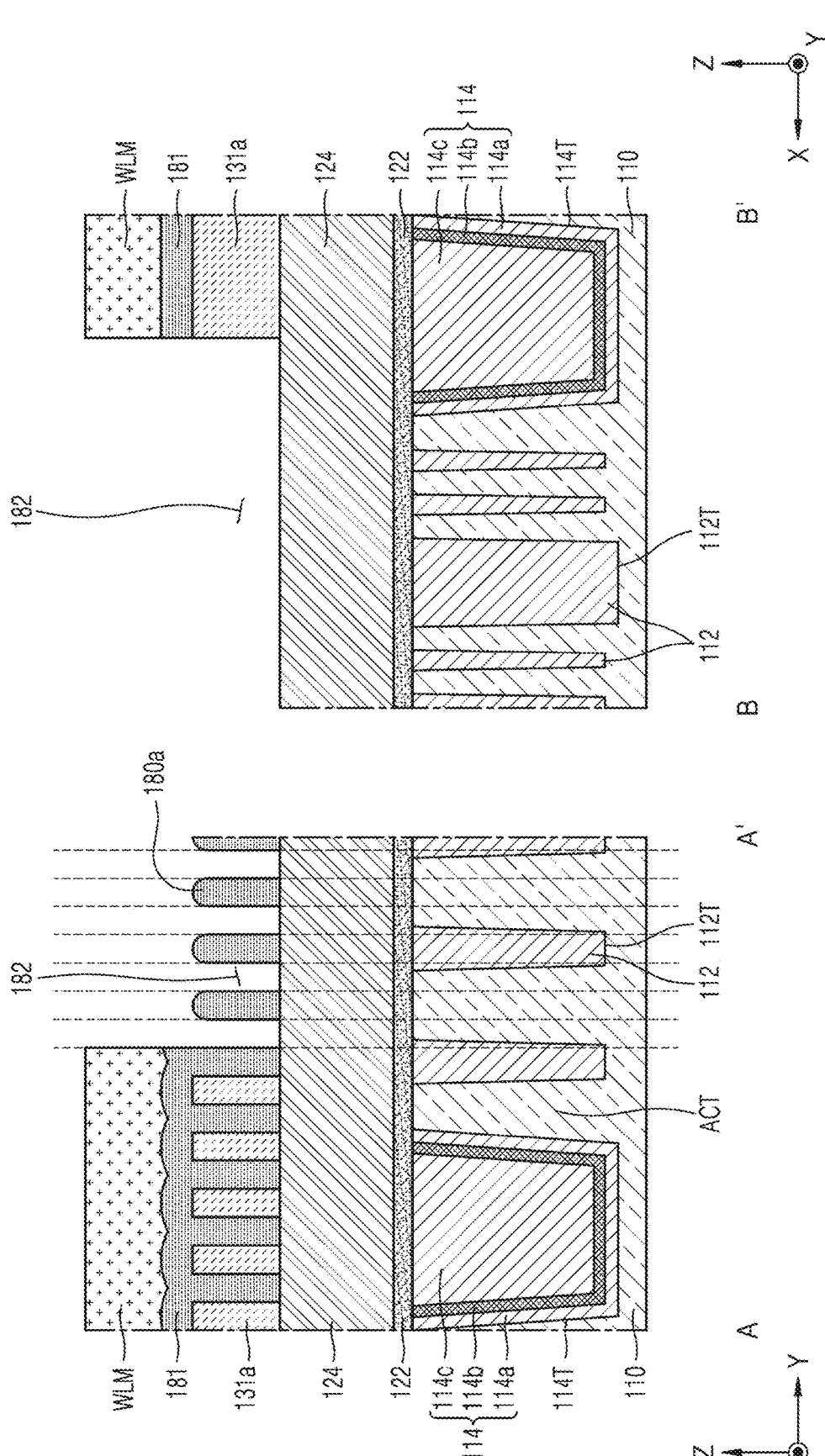

Referring to FIGS. 4O and 4P, a third mask pattern opening portion 182 exposing the buried layer 124 may be formed by removing the exposed third sacrificial pattern 130a in operation S164.

Figure 4Q:
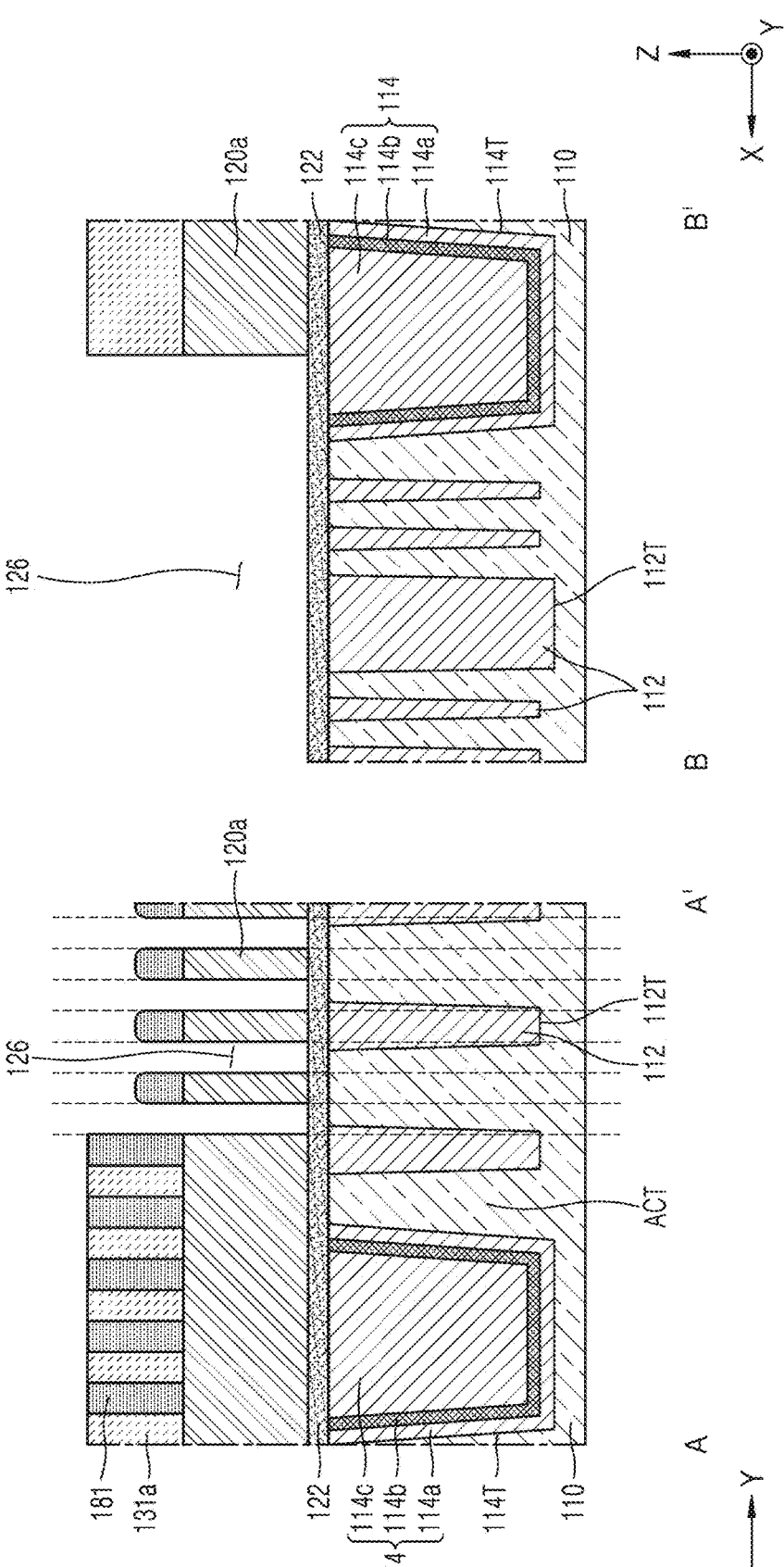

Referring to FIGS. 4P and 4Q, the buried pattern 120a may be formed by etching a portion of the buried layer 124 by using the third mask pattern 180a as an etch mask in operation S165. Therefore, a buried pattern opening portion 126 may be formed, and an upper surface of the lower insulation layer 122 may be exposed.

According to various example embodiments, the buried pattern opening portion 126 may overlap a portion of the field area F and a portion of the active area ACT in the vertical direction (the Z direction).

In some example embodiments, the word line mask WLM may be at least partially removed in operation S165 of forming the buried pattern 120a.

Figure 4R:
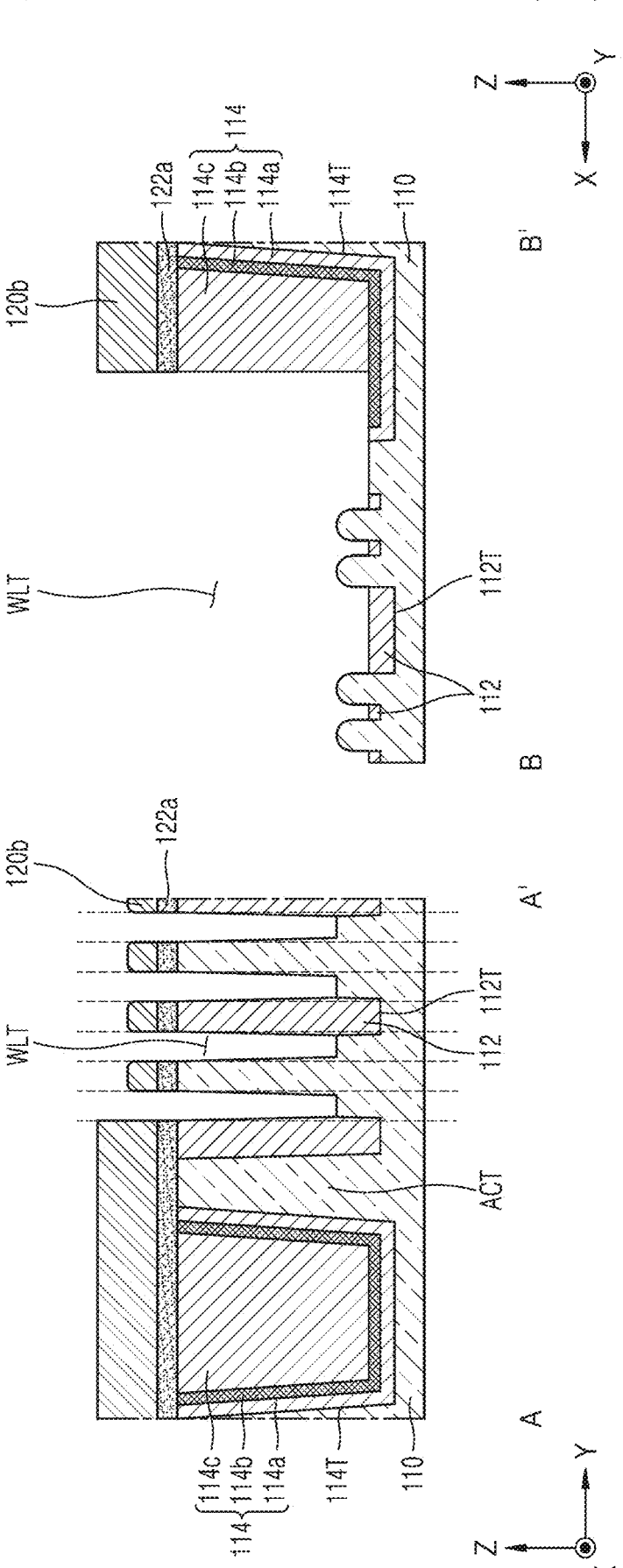
Figure 4S:
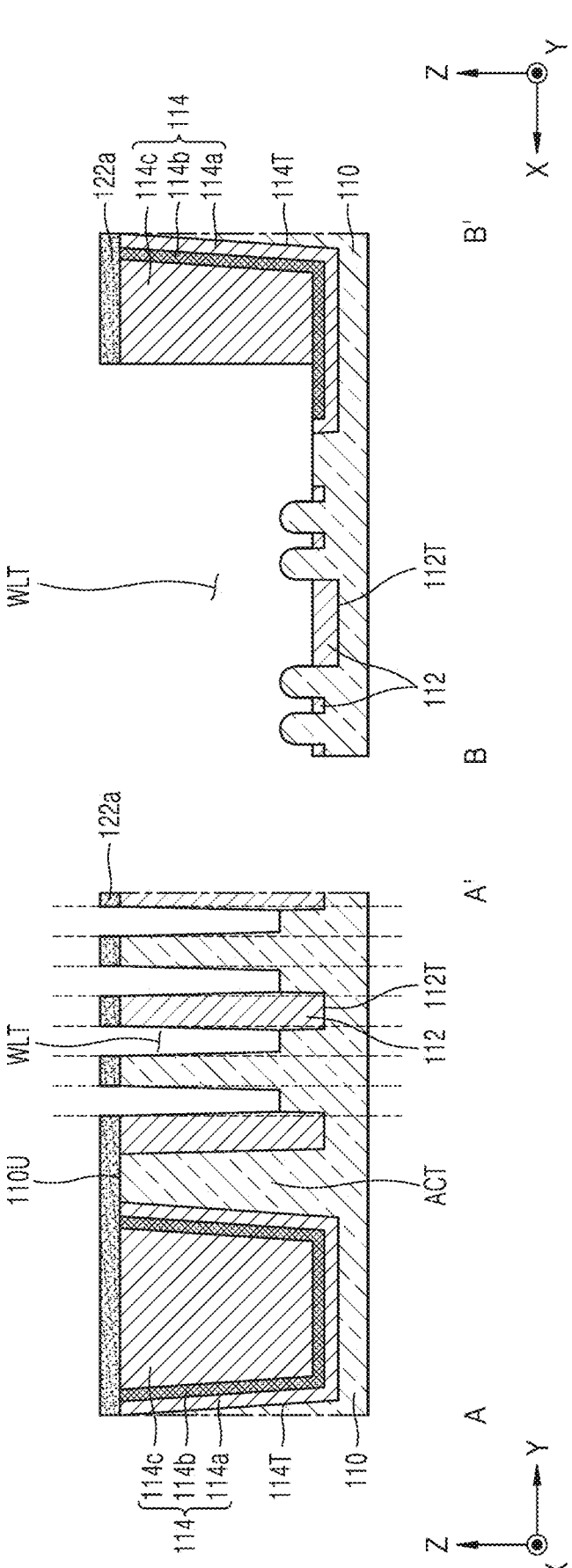

Referring to FIGS. 4R and 4S, a word line trench WLT may be formed by removing a portion of the lower insulation layer 122 and a portion of the semiconductor substrate 110 by using the buried pattern 120a as an etch mask in operation S170.

According to various example embodiments, the word line trench WLT may pass through a portion of the active area ACT and a portion of the field area F in the vertical direction (the Z direction). For example, the word line trench WLT may partially pass through a device isolation layer 112 of the field area F along with the active area ACT. According to various example embodiments, a sidewall of the active area ACT and a sidewall of the device isolation layer 112 may be partially exposed by the word line trench WLT.

According to various example embodiments, a plurality of word line trenches WLT may extend in the first horizontal direction (the X direction). According to various example embodiments, the plurality of word line trenches WLT may extend in the second horizontal direction (the Y direction).

According to various example embodiments, after the word line trench WLT is formed, the residual buried pattern 120b remaining on the lower insulation layer 122 may be removed. For example, the residual buried pattern 120b may be a portion of the buried pattern 120a remaining in a region covered by the word line mask WLM and a region exposed by the word line mask WLM. According to various example embodiments, a process of removing the residual buried pattern 120b may be performed on the semiconductor substrate 110 in an oxygen-containing atmosphere. For example, an ashing process such as an ozone ashing process may be performed in the oxygen-containing atmosphere. Accordingly, an upper surface of the lower insulation layer 122 may be completely exposed.

Hereinabove, a method of patterning the lower insulation layer 122, the buried layer 124, and the first to third sacrificial layers 130 to 150 to form the plurality of word line trenches WLT has been described, but the number of lower insulation layers, buried layers, and sacrificial layers for patterning is not limited thereto. For example, the number of sacrificial layers may be changed based on an area of the cell array area MCA and the number of word line trenches WLT which are to be formed.

FIG. 4T illustrates cross-sectional views taken along line A-A' and line B-B' of FIG. 2 for describing a process after forming the word line trench WLT, in the method S100 of manufacturing the integrated circuit device 100 according to various example embodiments.

Referring to FIG. 4T, a buried gate structure 210 may be formed in the word line trench WLT. For example, a gate dielectric layer 212 may be conformally formed in the word line trench WLT, and then, a gate electrode 214 and a capping insulation layer 216 may be sequentially formed. In this step, the lower insulation layer 122 on the semiconductor substrate 110 may be at least partially removed.

For example, a plurality of gate dielectric layers 212 may include a silicon oxide film, a silicon nitride film, a silicon oxynitride film, an oxide/nitride/oxide (ONO) film, or a high-k dielectric film having a dielectric constant which is higher than that of the silicon oxide film. For example, the plurality of gate electrodes 214 may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination thereof. For example, a plurality of capping insulation layers 216 may include silicon oxide, silicon nitride, silicon oxynitride, or a combination thereof.

According to various example embodiments, a first interlayer insulation layer 222 may be formed on the semiconductor substrate 110 including the buried gate structure 210. For example, the first interlayer insulation layer 222 may include one or more materials selected from among silicon oxide, silicon nitride, and silicon oxynitride.

According to various example embodiments, a first conductive layer 224 may be formed on the cell array area MCA of the semiconductor substrate 110. According to various example embodiments, an insulation structure IS may be formed in the boundary area BA. According to some example embodiments, the insulation structure IS may be sequentially formed together in a process of forming a bit line BL and a buried contact BC described below.

According to various example embodiments, the first conductive layer 224 may include polysilicon. For example, the first conductive layer 224 may include a doped polysilicon film. For example, the insulation structure IS may include oxide, nitride, or a combination thereof.

Subsequently, a digitline contact or a direct contact DC passing through the first conductive layer 224 and the first interlayer insulation layer 222 and partially passing through the active area ACT may be formed. For example, the direct contact DC may partially pass through a center portion of the active area ACT including a cross-sectional surface having a bar shape arranged in a diagonal direction. For example, the direct contact DC may include doped polysilicon, e.g. polysilicon doped with the same or different impurities and at the same or different concentration as that of the first conductive layer 224.

According to various example embodiments, a second conductive layer 226 and a bit line capping layer 232 may be sequentially formed on the direct contact DC and the first conductive layer 224. For example, the second conductive layer 226 may include doped polysilicon. For example, the bit line capping layer 232 may include silicon nitride.

Subsequently, a plurality of bit lines BL may be formed on the semiconductor substrate 110 by etching a portion of each of the bit line capping layer 232, the second conductive layer 226, the first conductive layer 224, and the direct contact DC. For example, a plurality of bit lines may include residual portions of each of the first conductive layer 224 and the second conductive layer 226. The bit line capping layer 232 and the bit line BL may configure a bit line structure.

Subsequently, an insulation spacer 233 covering both sidewalls of the bit line structure may be formed. For example, the insulation spacer 233 may include one or more materials selected from among silicon oxide, silicon nitride, and silicon oxynitride. Subsequently, a plurality of insulation fences 234 may each be formed between two adjacent bit lines BL of the plurality of bit lines BL. For example, the plurality of insulation fences 234 may include one or more materials selected from among silicon oxide, silicon nitride, and silicon oxynitride.

According to various example embodiments, a plurality of buried contacts (not shown) connected to both ends of the active area ACT having a bar shape and a plurality of landing pads 236 connected to the plurality of buried contacts may be formed. Subsequently, a plurality of landing pad isolation patterns 238 respectively insulating the plurality of landing pads 236 may be formed. For example, the plurality of buried contacts (not shown) may include doped polysilicon. For example, the plurality of landing pads 236 may include a plurality of layers, and each of the plurality of layers may include one or more materials selected from among Ti, TiN, Ta, TaN, W, WN, TiSiN, and WSiN. For example, the plurality of landing pad isolation patterns 238 may include one or more materials selected from among silicon oxide, silicon nitride, and silicon oxynitride.

Subsequently, a second interlayer insulation layer 242 may be formed on the plurality of landing pads 236 and the plurality of landing pad isolation patterns 238. Subsequently, a via plug (not shown) which passes through the second interlayer insulation layer 242 and is connected to the plurality of landing pads 326 may be formed, and a data storage (not shown) connected to the via plug (not shown) may be formed on the second interlayer insulation layer 242. For example, the data storage (not shown) may be a capacitor which includes a lower electrode, a dielectric film, and an upper electrode.

While the inventive concept has been particularly shown and described with reference to various example embodiments thereof, it will be understood that various changes in form and details may be made therein without departing from the spirit and scope of the following claims. Furthermore example embodiments are not necessarily mutually exclusive with one another. For example, some example embodiments may include one or more features described with reference to one or more figures, and may also include one or more other features described with reference to one or more other figures.

What is claimed is:

1. A method of manufacturing an integrated circuit device, the method comprising:
    preparing a semiconductor substrate having an active area and a field area;
    sequentially forming a lower insulation layer, a buried layer, a first sacrificial layer, a second sacrificial layer, and a third sacrificial layer on the semiconductor substrate;
    removing a portion of the third sacrificial layer to form a first sacrificial pattern;
    removing a portion of the second sacrificial layer and the first sacrificial pattern to form a second sacrificial pattern;
    removing a portion of the first sacrificial layer and the second sacrificial pattern to form a third sacrificial pattern;
    removing a portion of the buried layer and the third sacrificial pattern to form a buried pattern; and
    removing a portion of the lower insulation layer and a portion of the semiconductor substrate by using the buried pattern as an etch mask to form a word line trench,
    wherein the first sacrificial layer comprises polysilicon.

2. The method of claim 1, wherein the forming of the second sacrificial pattern comprises:
    forming a first mask layer conformally covering the first sacrificial pattern;
    partially removing the first mask layer to form a first mask pattern and to expose the first sacrificial pattern and the second sacrificial layer; and
    removing a portion of the second sacrificial layer and the first sacrificial pattern by using the first mask pattern as an etch mask.

3. The method of claim 1, wherein the forming of the third sacrificial pattern comprises:
    forming a second mask layer conformally covering the second sacrificial pattern;
    partially removing the second mask layer to form a second mask pattern and to expose the second sacrificial pattern and the first sacrificial layer; and
    removing a portion of the first sacrificial layer and the second sacrificial pattern by using the second mask pattern as an etch mask.

4. The method of claim 3, wherein the removing of the portion of the first sacrificial layer comprises:
    at least partially removing the second mask pattern through an etching process; and
    cleaning the semiconductor substrate by using hydrogen fluoride (HF).

5. The method of claim 1, wherein the forming of the buried pattern comprises:
    forming a third mask layer conformally covering the third sacrificial pattern;
    partially removing the third mask layer to form a third mask pattern and to expose the third sacrificial pattern; and
    removing a portion of the buried layer and the third sacrificial pattern by using the third mask pattern as an etch mask.

6. The method of claim 1, wherein the forming of the word line trench comprises:
    partially removing each of the lower insulation layer and the semiconductor substrate by using the buried pattern as an etch mask; and
    ashing the semiconductor substrate in an oxygen-containing atmosphere.

7. The method of claim 1, wherein each of the second sacrificial layer and the third sacrificial layer comprises a double layer with a first layer of the double layer having an etch selectivity with respect to a second layer of the double layer.

8. The method of claim 7, wherein the double layer of at least one of the second sacrificial layer and the third sacrificial layer comprises a spin-on hardmask film as the first layer and silicon oxynitride as the second layer, the silicon oxynitride covering the spin-on hardmask film.

9. The method of claim 1, wherein the buried layer comprises a single layer including an amorphous carbon layer.

10. The method of claim 1, wherein the word line trench passes through the active area and the field area.

11. A method of manufacturing an integrated circuit device, the method comprising:

forming a semiconductor substrate having a peripheral circuit area and a cell array area;

forming a lower insulation layer on the semiconductor substrate;

forming a buried layer on the lower insulation layer;

forming a first sacrificial layer on the buried layer, the first sacrificial layer including polysilicon;

forming a second sacrificial layer, including a first lower sacrificial layer and a first upper sacrificial layer having an etch selectivity with respect to each other, on the first sacrificial layer;

forming a third sacrificial layer, including a second lower sacrificial layer and a second upper sacrificial layer having an etch selectivity with respect to each other, on the second sacrificial layer;

removing a portion of the third sacrificial layer to form a first sacrificial pattern;

removing a portion of the second sacrificial layer and the first sacrificial pattern to form a second sacrificial pattern;

removing a portion of the first sacrificial layer and the second sacrificial pattern to form a third sacrificial pattern;

removing a portion of the buried layer and the third sacrificial pattern to form a buried pattern; and removing a portion of the lower insulation layer and a portion of the semiconductor substrate by using the buried pattern as an etch mask to form a word line trench.

12. The method of claim 11, wherein the forming of the buried pattern comprises:

forming a mask layer conformally covering the third sacrificial pattern;

partially removing the mask layer to form a mask pattern and expose the third sacrificial pattern;

forming a word line mask exposing the cell array area; and removing a portion of the buried layer and the third sacrificial pattern by using the mask pattern as an etch mask to form the buried pattern.

13. The method of claim 11, wherein the forming of the buried pattern comprises:

forming a mask layer conformally covering the third sacrificial pattern;

forming a word line mask exposing the cell array area;

partially removing the mask layer to form a mask pattern and expose the third sacrificial pattern; and removing a portion of the buried layer and the third sacrificial pattern by using the mask pattern as an etch mask to form the buried pattern.

14. The method of claim 11, wherein the forming of the word line trench comprises, after the word line trench is formed in the semiconductor substrate by using the buried pattern as an etch mask, removing the buried pattern in an oxygen-containing atmosphere.

15. The method of claim 11, wherein each of the first lower sacrificial layer and the second lower sacrificial layer comprises a spin-on hardmask, and each of the first upper sacrificial layer and the second upper sacrificial layer comprises silicon oxynitride.

16. The method of claim 11, wherein the buried layer comprises a single layer including an amorphous carbon layer.

17. A method of manufacturing an integrated circuit device, the method comprising:

forming a semiconductor substrate having a peripheral circuit area and a cell array area including an active area and a field area;

forming a lower insulation layer on the semiconductor substrate;

forming a buried layer on the lower insulation layer;

forming a first sacrificial layer on the buried layer, the first sacrificial layer including polysilicon;

forming a second sacrificial layer, including a first lower sacrificial layer and a first upper sacrificial layer having an etch selectivity with respect to each other, on the first sacrificial layer;

forming a third sacrificial layer, including a second lower sacrificial layer and a second upper sacrificial layer having an etch selectivity with respect to each other, on the second sacrificial layer;

removing the third sacrificial layer to form a first sacrificial pattern exposing the second sacrificial layer;

forming a first mask layer conformally covering the first sacrificial pattern and the exposed second sacrificial layer;

partially removing the first mask layer to form a first mask pattern covering a sidewall of the first sacrificial pattern;

removing a portion of the second sacrificial layer and the first sacrificial pattern by using the first mask pattern as an etch mask to form a second sacrificial pattern exposing the first sacrificial layer;

forming a second mask layer conformally covering the second sacrificial pattern and the exposed first sacrificial layer;

partially removing the second mask layer to form a second mask pattern covering a sidewall of the second sacrificial pattern;

removing a portion of the first sacrificial layer and the second sacrificial pattern by using the second mask pattern as an etch mask to form a third sacrificial pattern exposing the buried layer;

forming a third mask layer conformally covering the third sacrificial pattern and the exposed buried layer;

partially removing the third mask layer to form a third mask pattern covering the buried layer and a sidewall of the third sacrificial pattern;

removing a portion of the buried layer and the third sacrificial pattern by using the third mask pattern as an etch mask to form a buried pattern; and removing a portion of the lower insulation layer and a portion of the semiconductor substrate by using the buried pattern as an etch mask to form a word line trench passing through the active area and the field area.

18. The method of claim 17, wherein the forming of the third sacrificial pattern comprises removing the second mask pattern by using hydrogen fluoride (HF).

19. The method of claim 17, wherein the forming of the buried pattern comprises forming a word line mask covering the peripheral circuit area.

20. The method of claim 17, wherein the first sacrificial layer comprises a single layer.

\* \* \* \* \*